(12) United States Patent
Rehak et al.

(10) Patent No.: US 11,711,904 B2
(45) Date of Patent: *Jul. 25, 2023

(54) APPARATUS FOR COOLING ELECTRONIC CIRCUITRY

(71) Applicant: Crestron Electronics, Inc., Rockleigh, NJ (US)

(72) Inventors: William P Rehak, Oradell, NJ (US); Albert Pedoeem, West Orange, NJ (US); Alec J Magrini, Emerson, NJ (US); Sanjay Upasani, Manalapan, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 137 days.

This patent is subject to a terminal disclaimer.

(21) Appl. No.: 17/497,042

(22) Filed: Oct. 8, 2021

(65) Prior Publication Data

US 2022/0030742 A1     Jan. 27, 2022

Related U.S. Application Data

(63) Continuation-in-part of application No. 17/375,045, filed on Jul. 14, 2021, which is a continuation of application No. 16/534,398, filed on Aug. 7, 2019, now Pat. No. 11,076,501, which is a continuation-in-part of application No. 15/602,334, filed on May 23, 2017, now abandoned.

(60) Provisional application No. 62/345,169, filed on Jun. 3, 2016.

(51) Int. Cl.
*H05K 7/20*     (2006.01)

(52) U.S. Cl.
CPC ...... *H05K 7/20154* (2013.01); *H05K 7/20145* (2013.01); *H05K 7/20445* (2013.01)

(58) Field of Classification Search
CPC .......... H05K 7/20136; H05K 7/20154; H05K 7/20172; H05K 7/20145
USPC ................ 361/679.48, 679.46, 690; 454/184
See application file for complete search history.

(56) References Cited

U.S. PATENT DOCUMENTS

| | | | | |
|---|---|---|---|---|
| 4,062,273 A | * | 12/1977 | O'Connor | B61D 27/009 454/105 |
| 5,564,980 A | * | 10/1996 | Becker | F24F 7/08 454/252 |
| 5,694,294 A | * | 12/1997 | Ohashi | G06F 1/203 361/679.48 |

(Continued)

*Primary Examiner* — Ko-Wei Lin
(74) *Attorney, Agent, or Firm* — Crestron Electronics, Inc.

(57) ABSTRACT

Apparatus cools electronic circuitry. An enclosure surrounds the circuitry. Air intake holes are only in a portion of a first panel that faces a first direction. Air exhaust holes are only in a portion of a second panel that faces a second direction opposite the first. Air plenum piece is disposed within the enclosure, and a substantially planar portion extends from a first panel inner wall and ends a distance from a second panel inner wall. At least one tab extends from the substantially planar portion to an upper panel inner wall. The air plenum piece divides an enclosure interior into a first volume, enclosed by the first panel inner wall, substantially planar portion, at least one tab, and upper panel inner wall, into which the air intake holes open and a second volume into which the air exhaust holes open. The second volume is a remaining interior volume.

13 Claims, 26 Drawing Sheets

(56) References Cited

U.S. PATENT DOCUMENTS

| | | | | |
|---|---|---|---|---|
| 6,252,770 B1* | 6/2001 | Yu | G06F 1/20 | 361/679.48 |
| 6,310,771 B1* | 10/2001 | Chien | H01L 23/467 | 174/16.3 |
| 6,458,028 B2* | 10/2002 | Snyder | F04D 25/088 | 454/292 |
| 7,525,799 B2* | 4/2009 | Lai | H05K 7/20572 | 361/695 |
| 7,643,293 B2* | 1/2010 | Chu | F28D 15/0275 | 361/679.48 |
| 7,869,212 B2* | 1/2011 | Kong | H01L 23/467 | 361/679.48 |
| 8,248,795 B2 | 8/2012 | Chang | | |
| 8,462,505 B2* | 6/2013 | Nagami | B23K 9/1006 | 219/133 |
| 8,570,742 B2* | 10/2013 | Yeh | G06F 1/20 | 361/679.48 |
| 8,634,193 B2* | 1/2014 | Zhou | H05K 7/20127 | 361/679.48 |
| 8,964,374 B1* | 2/2015 | Sheng | H05K 7/20836 | 361/679.49 |
| 8,988,878 B2* | 3/2015 | Lin | G06F 1/203 | 361/679.48 |
| 9,170,615 B2* | 10/2015 | Wilke | H05K 7/20727 | |
| 9,557,785 B2* | 1/2017 | Lin | G06F 1/20 | |
| 9,585,286 B2 | 2/2017 | Horiuchi | | |
| 9,764,347 B2* | 9/2017 | Nudelman | B05B 16/60 | |
| 9,861,005 B2 | 1/2018 | Li | | |
| 2002/0114138 A1* | 8/2002 | Laufer | H05K 9/0037 | 361/695 |
| 2008/0232063 A1* | 9/2008 | Koo | G06F 1/203 | 361/679.48 |
| 2009/0103265 A1* | 4/2009 | Hongo | G06F 1/203 | 361/690 |
| 2012/0020014 A1* | 1/2012 | Chang | H05K 7/20727 | 361/679.48 |
| 2012/0100795 A1* | 4/2012 | Ishimine | F24F 13/0227 | 165/104.34 |
| 2012/0121487 A1* | 5/2012 | Jewell-Larsen | H01L 23/467 | 422/171 |
| 2012/0129442 A1* | 5/2012 | Wei | H05K 7/1497 | 454/184 |
| 2012/0276834 A1* | 11/2012 | Peng | H05K 7/20745 | 454/184 |
| 2012/0318756 A1* | 12/2012 | Elwany | H05K 7/18 | 211/26 |
| 2013/0045671 A1* | 2/2013 | Apple | F24F 11/0001 | 454/239 |
| 2013/0050942 A1* | 2/2013 | Konishi | H05K 7/20127 | 361/692 |
| 2014/0235156 A1* | 8/2014 | Li | H05K 7/20154 | 454/184 |
| 2014/0362529 A1* | 12/2014 | Tsuchida | H05K 7/20127 | 361/690 |
| 2015/0017905 A1* | 1/2015 | Li | H05K 7/20163 | 454/184 |
| 2015/0065029 A1* | 3/2015 | Leckelt | F24F 11/0001 | 454/184 |
| 2015/0109733 A1* | 4/2015 | Horiuchi | H05K 7/20136 | 361/695 |
| 2015/0156917 A1* | 6/2015 | Ogawa | H05K 7/20136 | 361/695 |
| 2015/0195952 A1* | 7/2015 | Tsunoda | G06F 1/203 | 361/690 |
| 2016/0088760 A1* | 3/2016 | Yukito | H05K 7/20136 | 361/679.48 |
| 2016/0106000 A1* | 4/2016 | Tang-Kong | F28F 3/048 | 165/80.3 |
| 2016/0124473 A1* | 5/2016 | Lin | H05K 7/20136 | 361/679.49 |
| 2016/0143180 A1* | 5/2016 | Zhu | H05K 7/20572 | 165/80.2 |
| 2016/0269099 A1* | 9/2016 | Auricchio, Jr. | H04B 7/18515 | |
| 2016/0302327 A1* | 10/2016 | Dangy-Caye | H05K 7/20127 | |
| 2017/0083058 A1* | 3/2017 | Janak | G06F 1/20 | |
| 2017/0085063 A1* | 3/2017 | Johnson | H05K 7/20145 | |
| 2017/0155984 A1* | 6/2017 | Ting | H04R 1/2811 | |
| 2017/0185113 A1* | 6/2017 | Wang | F28F 13/003 | |
| 2018/0298921 A1* | 10/2018 | Niemann | F28F 3/04 | |

* cited by examiner

VIEW A-A

VIEW B-B

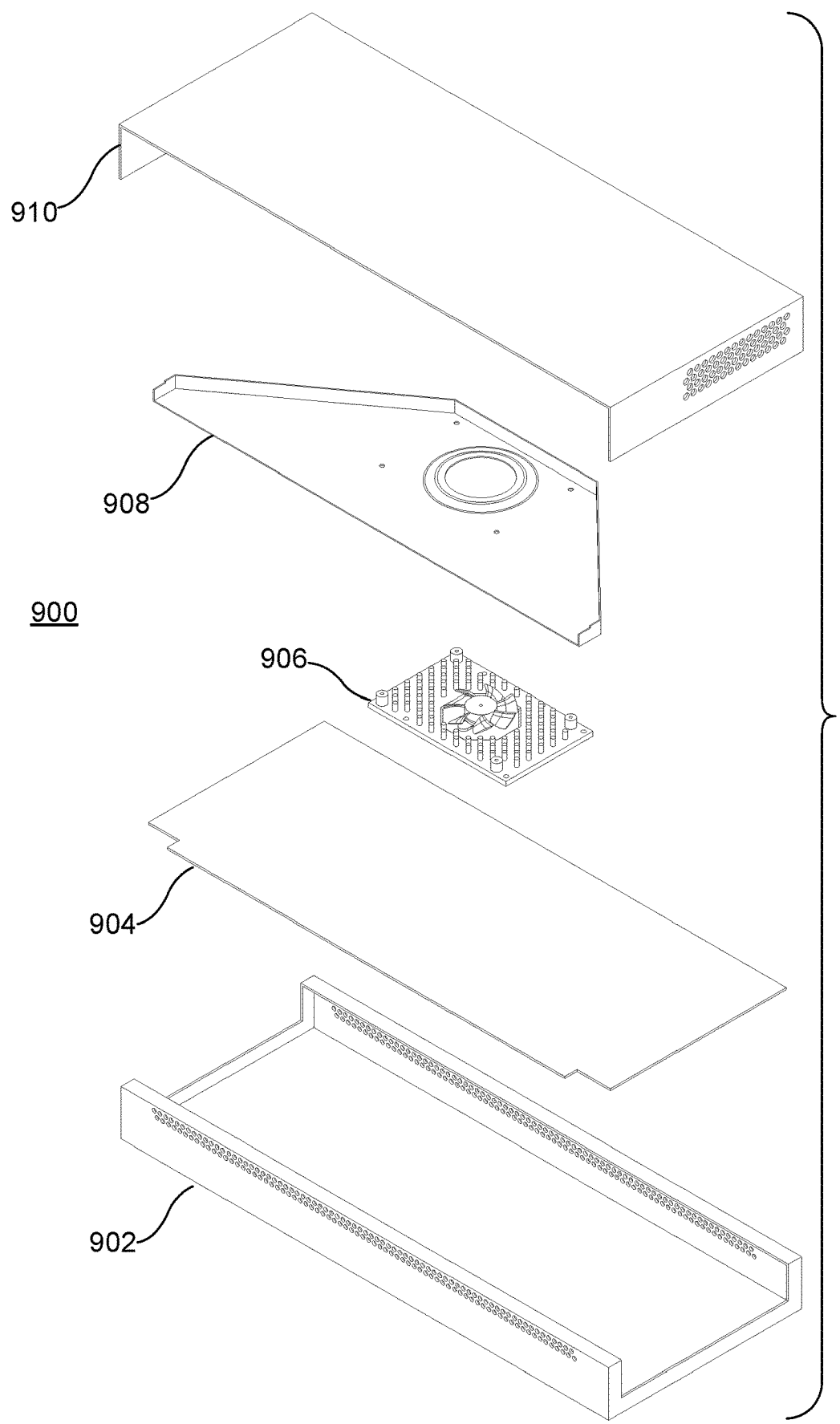

APPARATUS FOR COOLING ELECTRONIC CIRCUITRY

CROSS-REFERENCE TO RELATED APPLICATIONS

This application is a continuation-in-part of U.S. patent application Ser. No. 17/375,045, filed Jul. 14, 2021, which is a continuation of U.S. patent application Ser. No. 16/534,398, filed Aug. 7, 2019, now U.S. Pat. No. 11,076,501, issued Jul. 27, 2021, which is a continuation-in-part of U.S. patent application Ser. No. 15/602,334, filed May 23, 2017, now abandoned, which claims the benefit of the filing date of U.S. Provisional Patent Application No. 62/345,169, filed Jun. 3, 2016. The disclosures of each of these applications are incorporated herein by reference.

BACKGROUND OF THE INVENTION

Technical Field

Aspects of the embodiments relate generally to rack mounted equipment housings, and more specifically to systems, methods, and modes for cooling of circuitry located within rack mounted equipment housings that substantially eliminates or prevents problems associated with currently available technology.

Background Art

As those of skill in the art of the design, manufacture, and sale of electronic equipment can no doubt appreciate, fans are sometimes necessary to cool integrated circuits, such as those use in transmitters and receivers sold in DigitalMedia™ (DM) products manufactured by Crestron® Electronics, Inc., of Rockleigh, N.J., due to their high thermal dissipation levels. Typically, fans are located either to the side of the high wattage device, or right above the high wattage device in order to cool the device effectively, or at least to try and cool the device effectively. A typical installation places the vent holes in the container housing (housing) right above the fan. This approach introduces several drawbacks: If the vent holes are blocked during installation, this will result in overheating the equipment. This is a likely scenario when equipment is installed behind the display. In addition, placing the fan right behind the vent holes causes high acoustic noise. Further, the fan may be visible from outside of the housing, detracting from the aesthetic appearance of the device.

Accordingly, a need has arisen for systems, methods, and modes for cooling of circuitry located within rack mounted equipment housings that substantially eliminates or prevents problems associated with currently available technology.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. It is to be understood that both the general and detailed descriptions that follow are exemplary and explanatory only and are not restrictive.

DISCLOSURE OF INVENTION

In accordance with an aspect, an apparatus for cooling electronic circuitry comprises an enclosure configured to surround the electronic circuitry, the enclosure including a plurality of panels, wherein a first one of the plurality of panels faces a first direction, a plurality of air intake holes are disposed in the first one of the plurality of panels only in a portion thereof, a second one of the plurality of panels faces a second direction that is opposite to that of the first direction, and a plurality of air exhaust holes are disposed in the second one of the plurality of panels only in a portion thereof; and an air plenum piece disposed within the enclosure and including a substantially planar portion that extends from an inner wall of the first one of the plurality of panels and that ends at a distance from an inner wall of the second one of the plurality of panels, and at least one tab that extends from the substantially planar portion of the air plenum piece to an inner wall of an upper one of the plurality of panels, the air plenum piece being configured to divide an interior region of the enclosure into a first volume into which the plurality of air intake holes open and a second volume into which the plurality of air exhaust holes open, the first volume being enclosed by the inner wall of the first one of the plurality of panels, the substantially planar portion of the air plenum piece, the at least one tab of the air plenum piece, and the inner wall of the upper one of the plurality of panels, the second volume being a remaining volume of the interior region, the air plenum piece having an air plenum hole that forms an opening between the first volume and the second volume.

According to a further aspect, an apparatus for cooling electronic circuitry comprises an enclosure configured to surround the electronic circuitry, the enclosure including a plurality of panels, wherein a first one of the plurality of panels faces a first direction, a plurality of air intake holes are disposed in the first one of the plurality of panels only in a portion thereof, a second one of the plurality of panels faces a second direction that is opposite to that of the first direction, and a plurality of air exhaust holes are disposed in the second one of the plurality of panels only in a portion thereof; and an air plenum piece disposed within the enclosure and including a substantially planar portion that extends from an inner wall of the first one of the plurality of panels and that ends at a distance from an inner wall of the second one of the plurality of panels, and a plurality of tabs that extend from the substantially planar portion of the air plenum piece to an inner wall of an upper one of the plurality of panels, including an end tab located at an edge of the substantially planar portion of the air plenum piece that is closest to an inner wall of the second one of the plurality of panels, at least one side tab located at a side edge of the substantially planar portion of the air plenum piece, the side edge of the substantially planar portion of the air plenum piece being spaced apart from an inner wall of an adjacent side panel of the plurality of panels, and at least another side tab located at another side edge of the substantially planar portion of the air plenum piece, the another side edge of the substantially planar portion of the air plenum piece being spaced apart from an inner wall of another side panel of the plurality of panels, the at least another side tab extending only along a portion of the another side edge of the substantially planar portion of the air plenum piece, so that at least some of the air in the second volume is recirculated into the first volume, the air plenum piece being configured to divide an interior region of the enclosure into a first volume into which the plurality of air intake holes open and a second volume into which the plurality of air exhaust holes open, the first volume being enclosed by the inner wall of the first one of the plurality of panels, the substantially planar portion of the air plenum piece, the plurality of tabs, and the inner wall of the upper one of the plurality of panels, the second volume being a remaining volume of the interior region, the air plenum piece having an air plenum hole that forms an opening between the first volume and the second volume.

According to another aspect, an apparatus for cooling electronic circuitry comprises an enclosure configured to surround the electronic circuitry, the enclosure including a plurality of panels, wherein a first one of the plurality of panels faces a first direction, a plurality of air intake holes are disposed in the first one of the plurality of panels only in an upper portion thereof, a second one of the plurality of panels faces a second direction that is opposite to that of the first direction, and a plurality of air exhaust holes are disposed in the second one of the plurality of panels only in an upper portion thereof; an air plenum piece disposed within the enclosure and including a substantially planar portion that extends from an inner wall of the first one of the plurality of panels and that ends at a distance from an inner wall of the second one of the plurality of panels, and a plurality of tabs that extend from the substantially planar portion of the air plenum piece to an inner wall of an upper one of the plurality of panels, including an end tab located at an edge of the substantially planar portion of the air plenum piece that is closest to an inner wall of the second one of the plurality of panels, at least one side tab located at a side edge of the substantially planar portion of the air plenum piece, the side edge of the substantially planar portion of the air plenum piece being spaced apart from an inner wall of an adjacent side panel of the plurality of panels, and at least another side tab located at another side edge of the substantially planar portion of the air plenum piece, the another side edge of the substantially planar portion of the air plenum piece being spaced apart from an inner wall of another side panel of the plurality of panels, the at least another side tab extending only along a portion of the another side edge of the substantially planar portion of the air plenum piece, so that at least some of the air in the second volume is recirculated into the first volume, the air plenum piece being configured to divide an interior region of the enclosure into a first volume into which the plurality of air intake holes open and a second volume into which the plurality of air exhaust holes open, the first volume being enclosed by the inner wall of the first one of the plurality of panels, the substantially planar portion of the air plenum piece, the plurality of tabs, and the inner wall of the upper one of the plurality of panels, the second volume being a remaining part of the interior region, the air plenum piece having an air plenum hole that forms an opening between the first volume and the second volume; a heat sink configured to be in thermal contact with the electronic circuitry and conduct heat generated by the electronic circuitry; a fan located in coaxial alignment with the air plenum hole, the heat sink and the electronic circuitry each being located in the second volume, whereby when the fan operates, cooling air is drawn from an exterior of the enclosure through the plurality of air intake holes into the first volume, then through the air plenum hole into the second volume, then over the heat sink to remove heat away from the heat sink, and thereafter through the plurality of air exhaust holes into the exterior of the enclosure; and a bottom panel configured to support a circuit board holding the electronic circuitry.

BRIEF DESCRIPTION OF DRAWINGS

The accompanying figures further illustrate the present embodiments.

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the present embodiments. In the drawings, like reference numerals designate corresponding parts throughout the several views.

BRIEF DESCRIPTION OF THE SEVERAL VIEWS OF THE DRAWING

Figure 1:
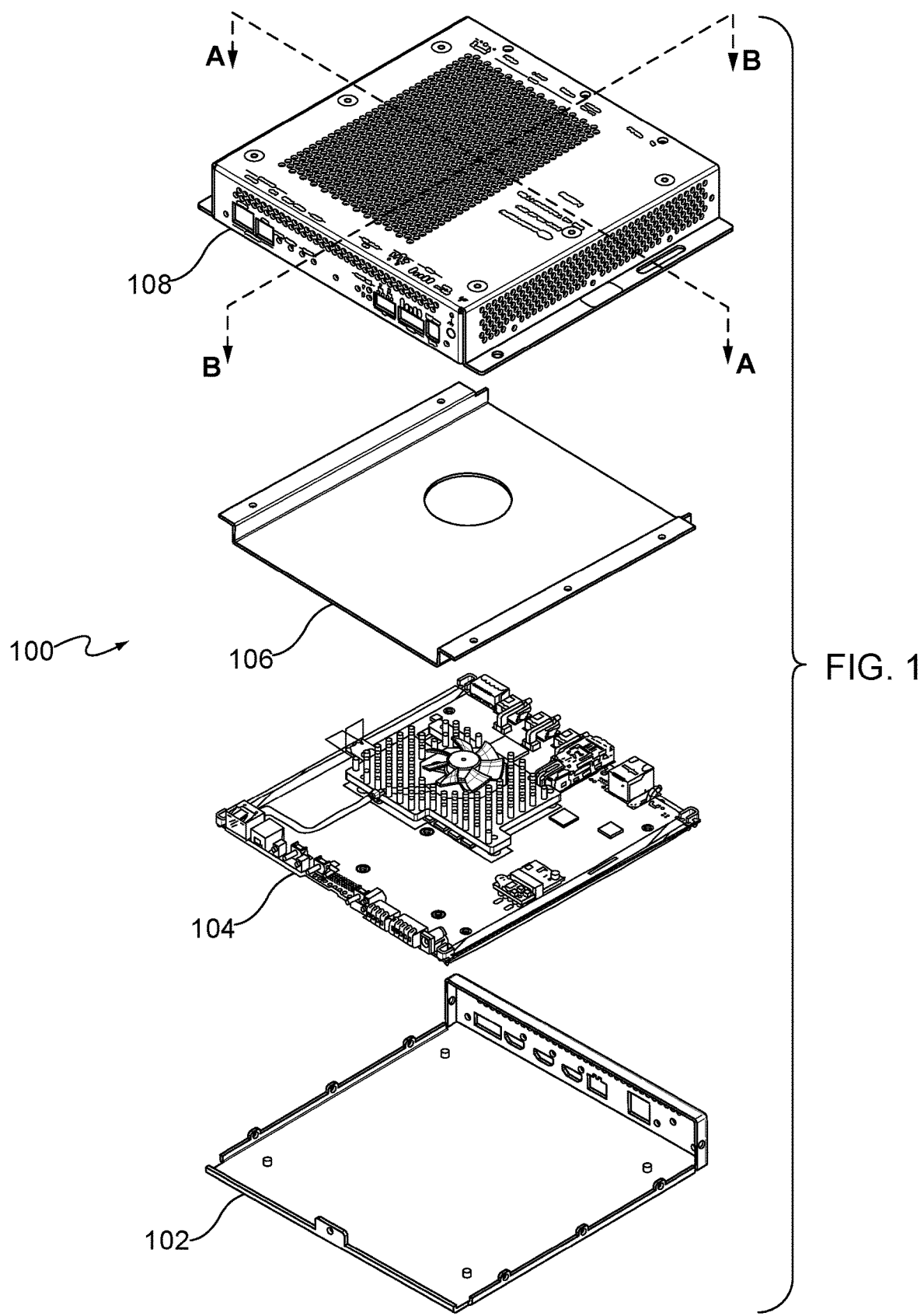

FIG. 1 shows an exploded perspective view of a housing of electronic circuitry in which a cooling apparatus has been implemented according to aspects of the embodiments.

Figure 2A:
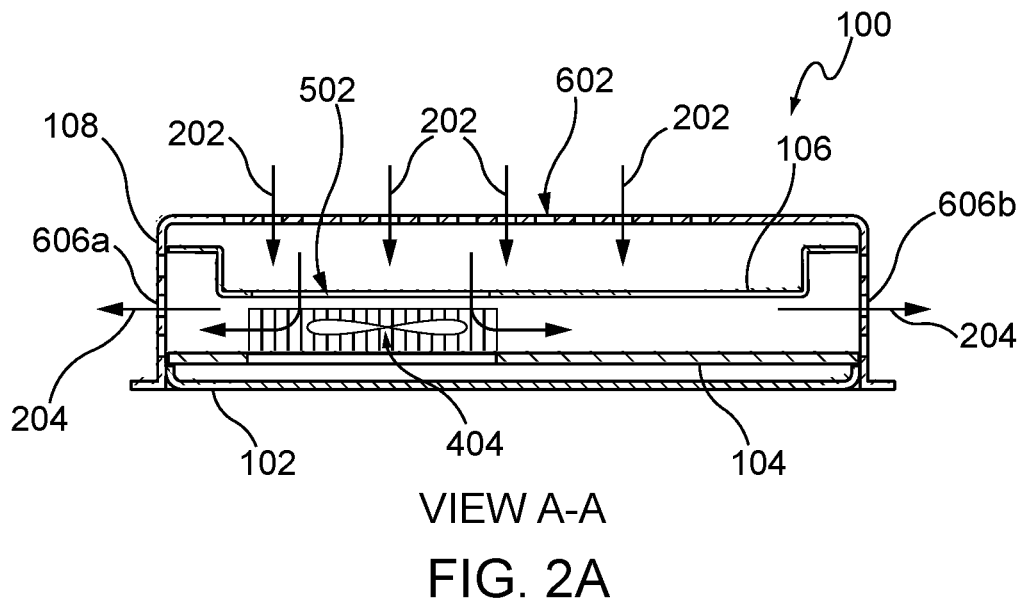

FIG. 2A shows a sectional view along lines A-A of FIG. 1 of the cooling apparatus according to aspects of the embodiments.

Figure 2B:
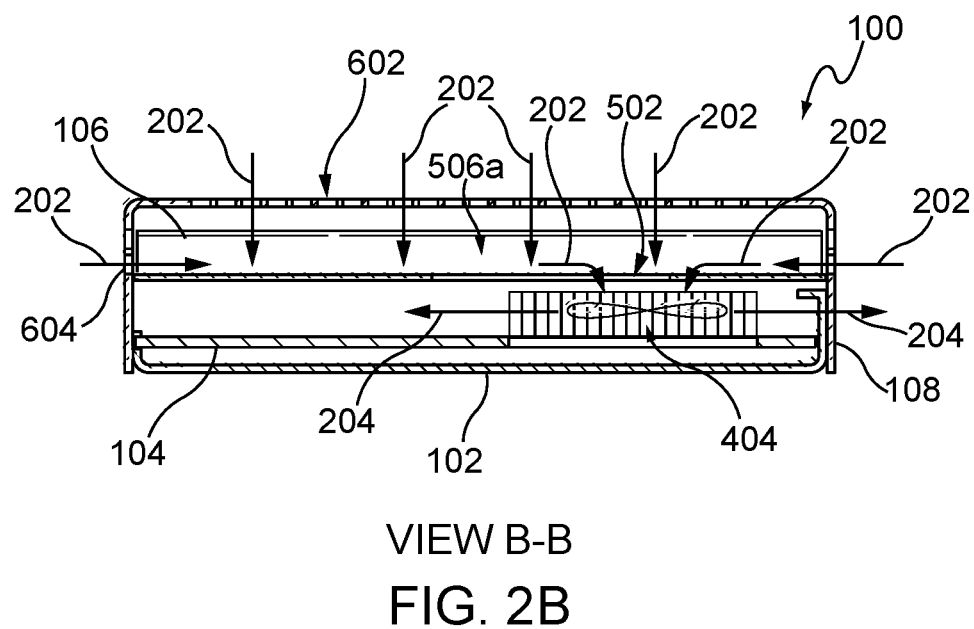

FIG. 2B shows a sectional view along lines B-B of FIG. 1 of the cooling apparatus according to aspects of the embodiments.

Figure 3:
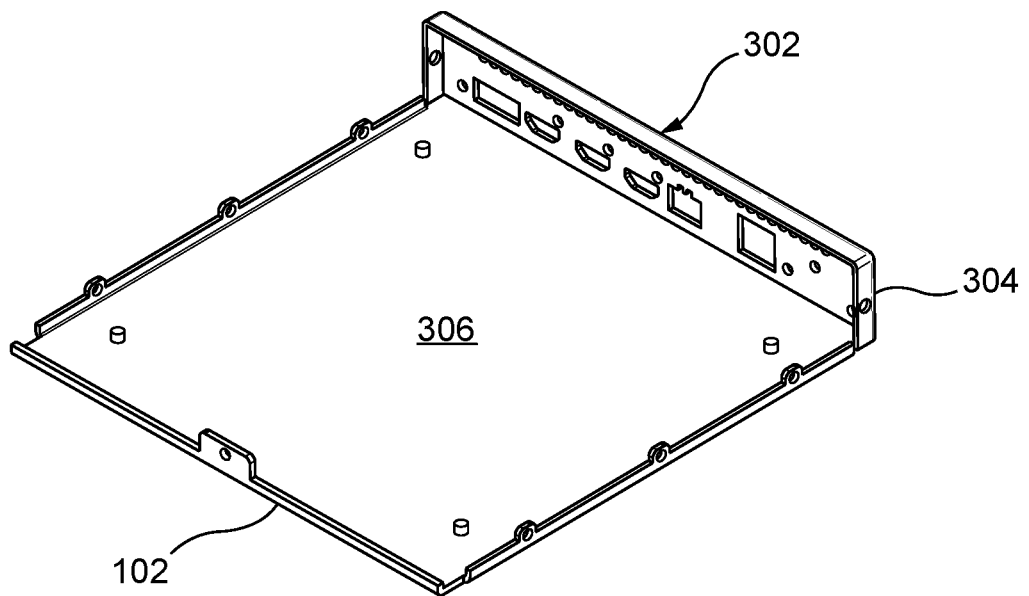

FIG. 3 shows a perspective view of a bottom portion of the cooling apparatus of FIGS. 1 and 2 according to aspects of the embodiments.

Figure 4:
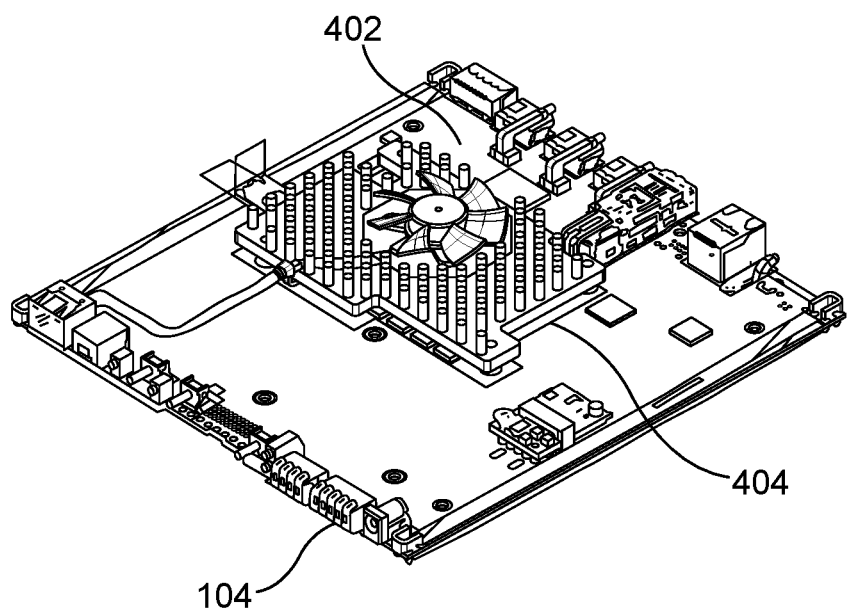

FIG. 4 shows a perspective view of an electronic printed circuit board with a cooling fan mounted thereupon according to aspects of the embodiments.

Figure 5A:
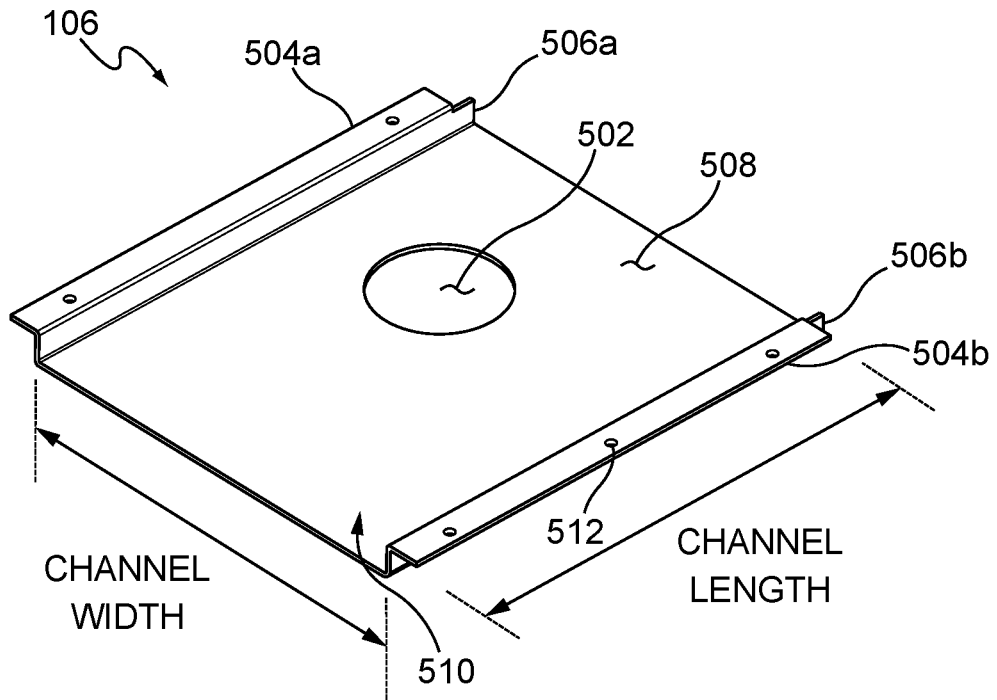

FIG. 5A shows a perspective view of an air plenum piece used in the cooling apparatus of FIGS. 1 and 2 according to aspects of the embodiments.

Figure 5B:
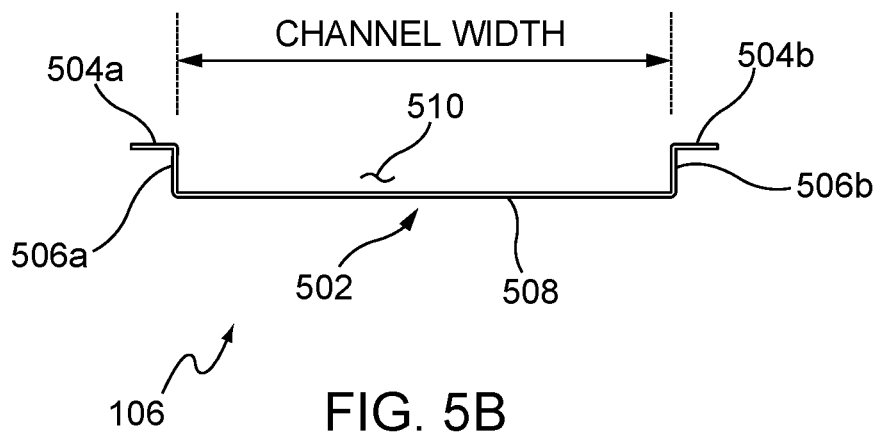

FIG. 5B shows a side view of the air plenum piece used in the cooling apparatus of FIGS. 1 and 2 according to aspects of the embodiments.

Figure 6:
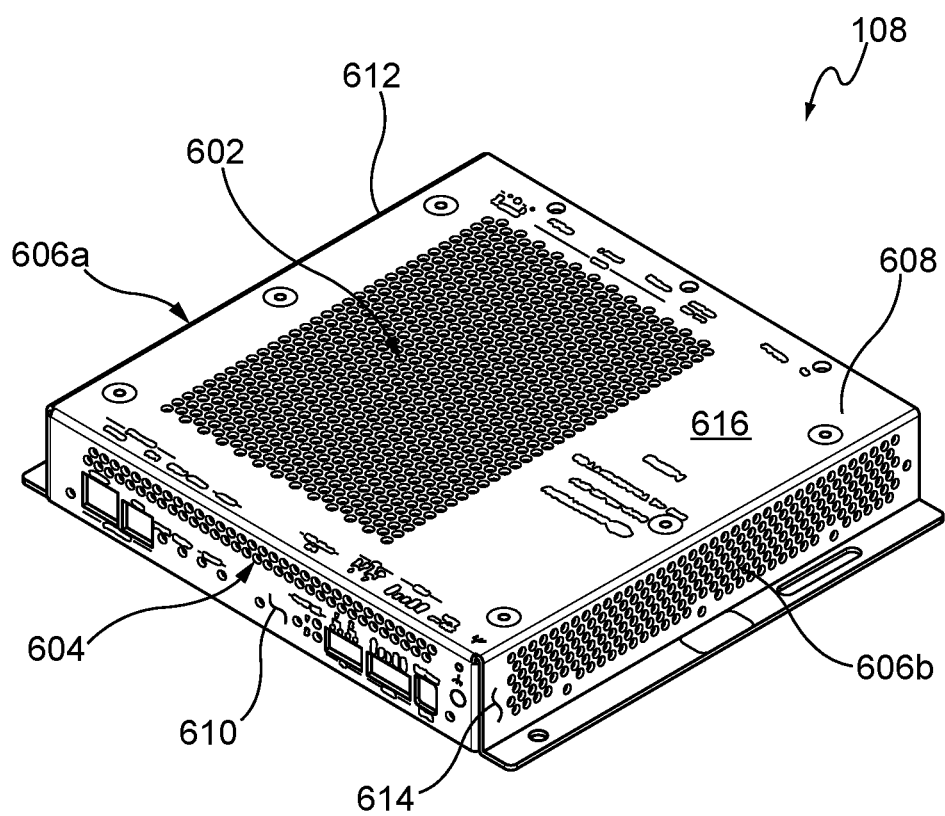

FIG. 6 shows a perspective view of an upper portion of the cooling apparatus of FIGS. 1 and 2 according to aspects of the embodiments.

Figure 7:
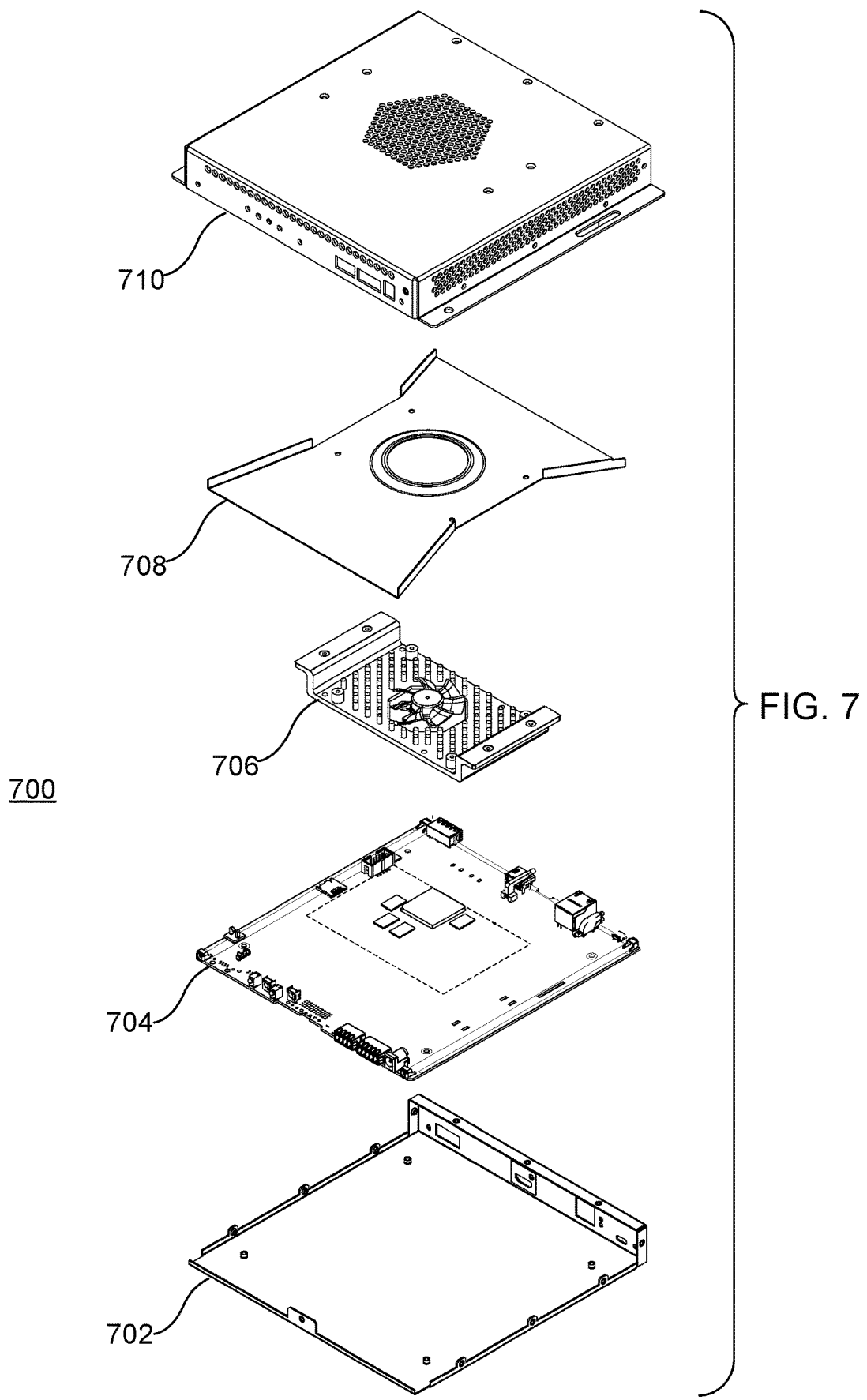

FIG. 7 shows an exploded perspective view of a housing of electronic circuitry in which a cooling apparatus has been implemented according to aspects of other embodiments.

Figure 8A:
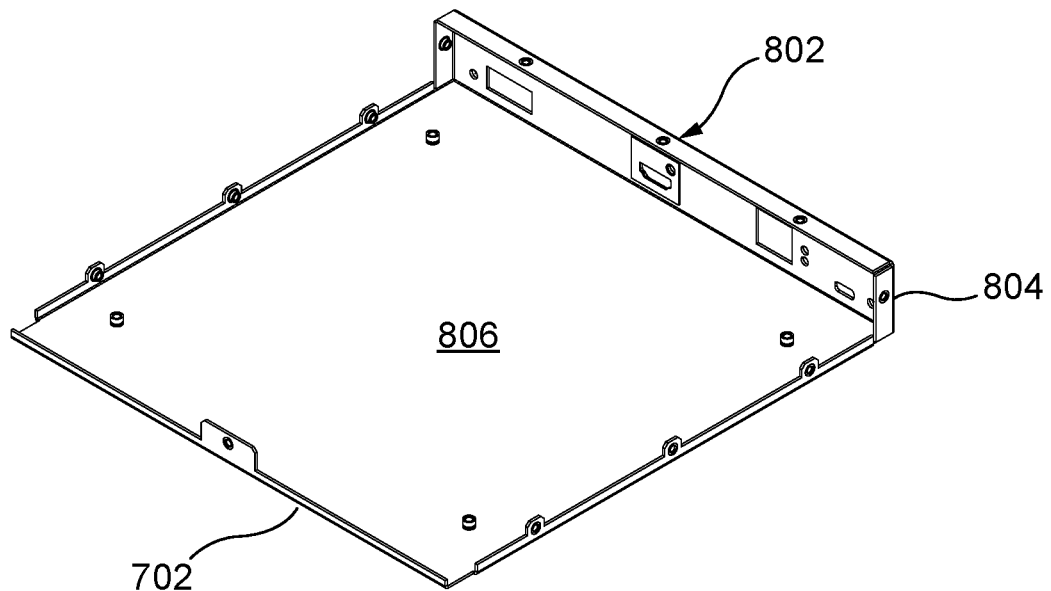

FIG. 8A shows a perspective view of a bottom portion of the cooling apparatus of FIG. 7.

Figure 8B:
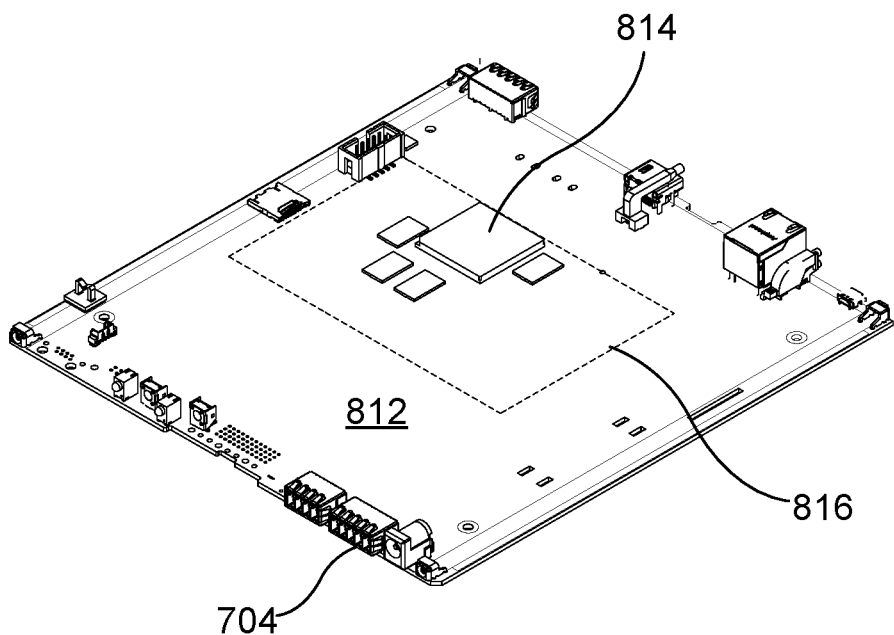

FIG. 8B shows a perspective view of an electronic printed circuit board disposed within the cooling apparatus of FIG. 7.

Figure 8C:
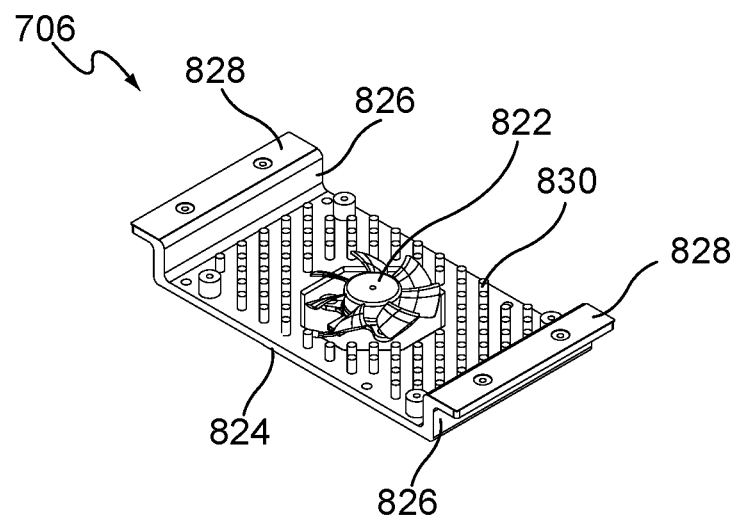

FIG. 8C shows a perspective view of a heat sink and cooling fan of the cooling apparatus of FIG. 7.

Figure 8D:
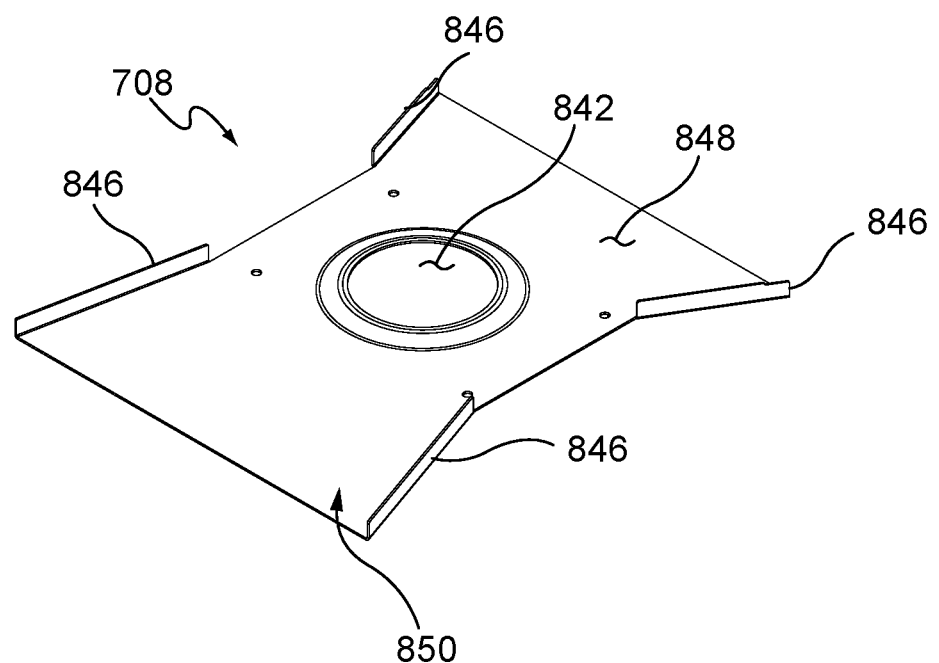

FIG. 8D shows a perspective view of an air plenum piece of the cooling apparatus of FIG. 7.

Figure 8E:
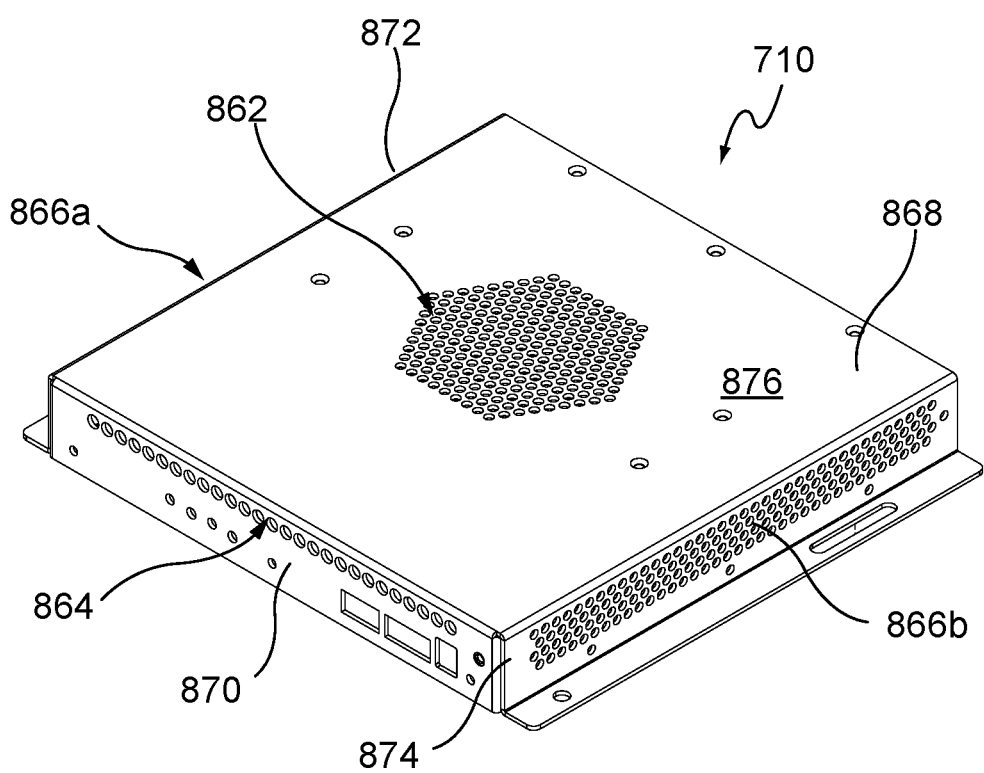

FIG. 8E shows a perspective view of an upper portion of the cooling apparatus of FIG. 7.

FIG. 9 shows an exploded perspective view of a housing of electronic circuitry in which a cooling apparatus has been implemented according to aspects of still other embodiments.

Figure 10A:
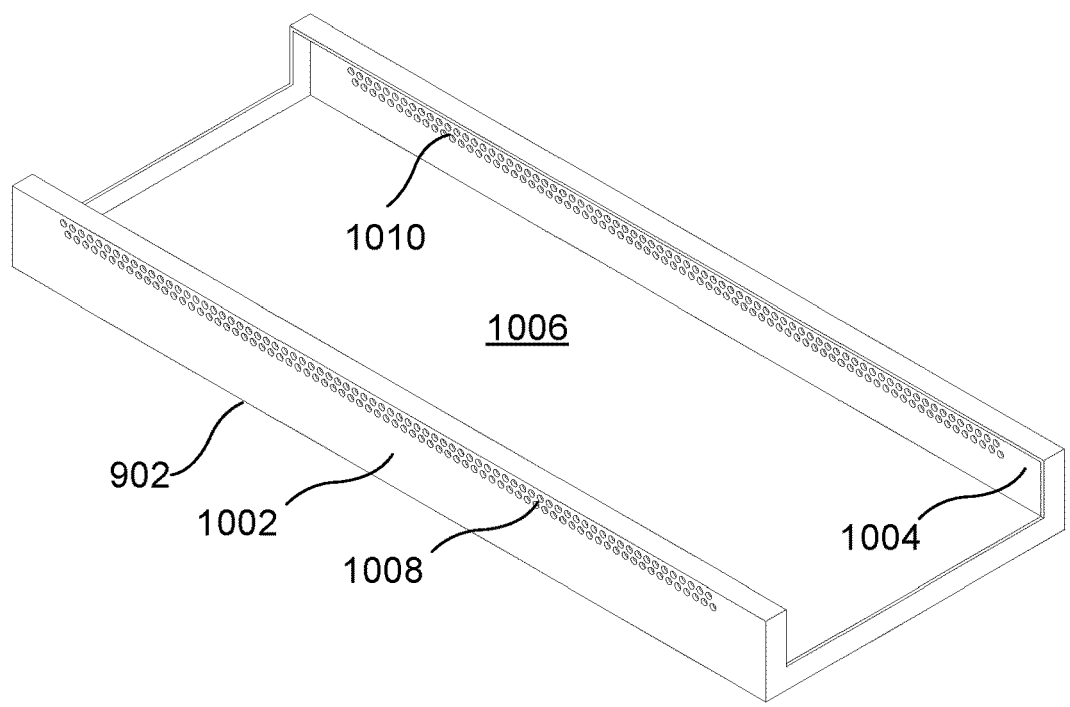

FIG. 10A shows a perspective view of a bottom portion of the cooling apparatus of FIG. 9.

Figure 10B:
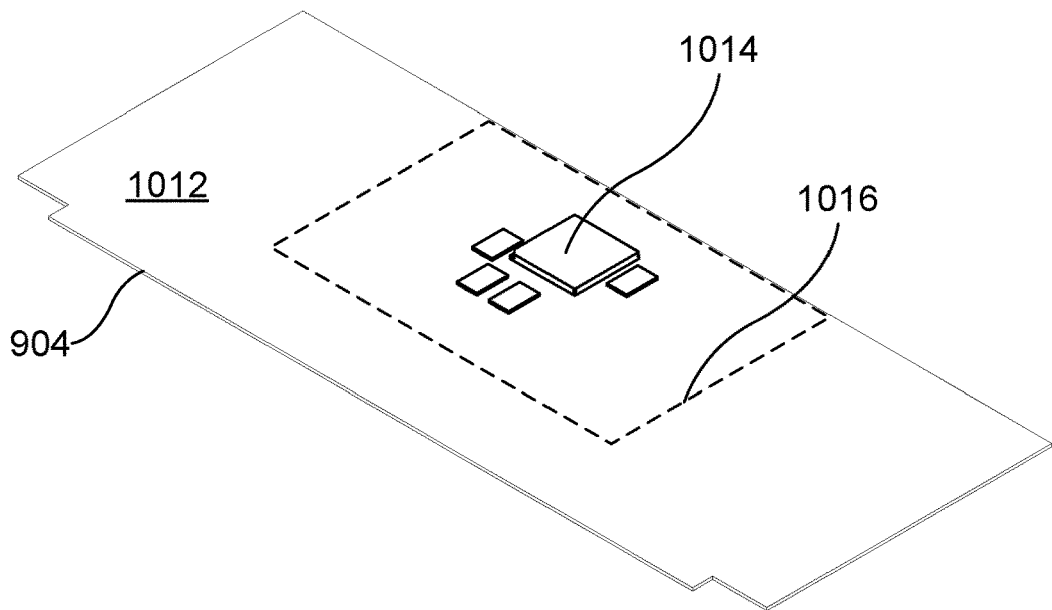

FIG. 10B shows a perspective view of an electronic printed circuit board disposed within the cooling apparatus of FIG. 9.

Figure 10C:
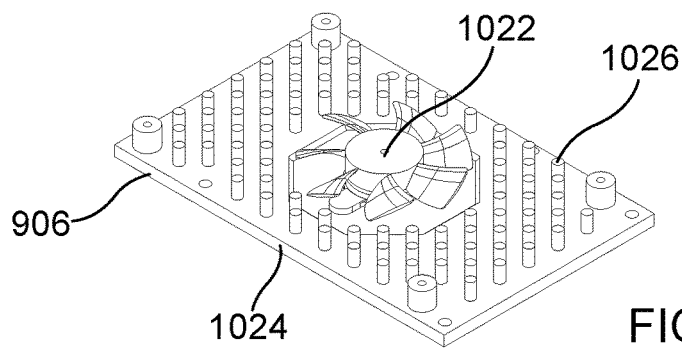

FIG. 10C shows a perspective view of a heat sink and cooling fan of the cooling apparatus of FIG. 9.

Figure 10D:
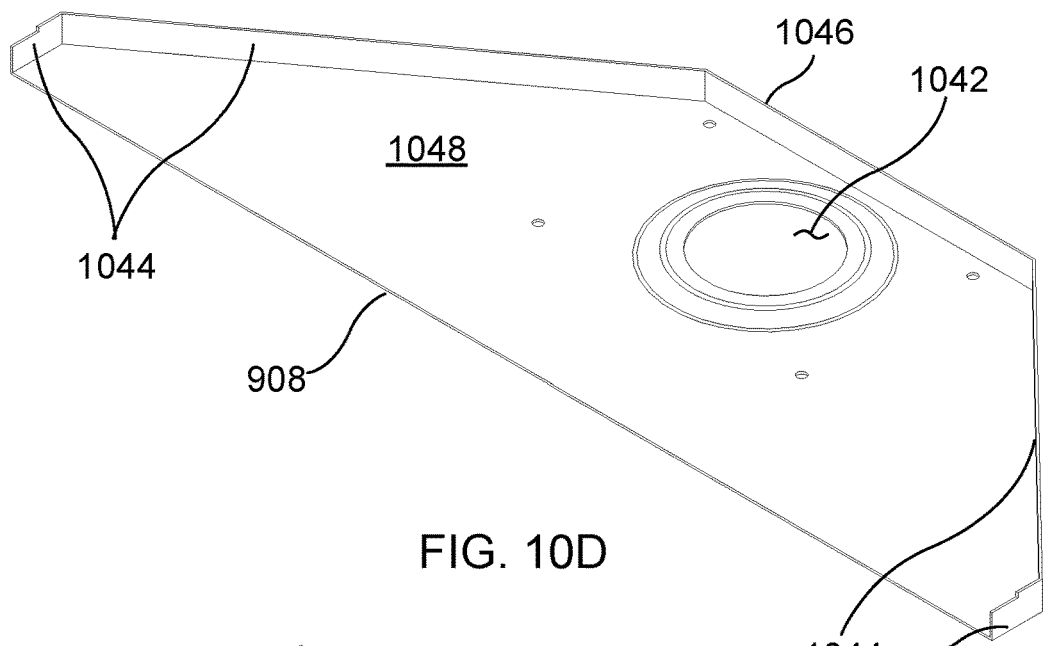

FIG. 10D shows a perspective view of an air plenum piece of the cooling apparatus of FIG. 9.

Figure 10E:
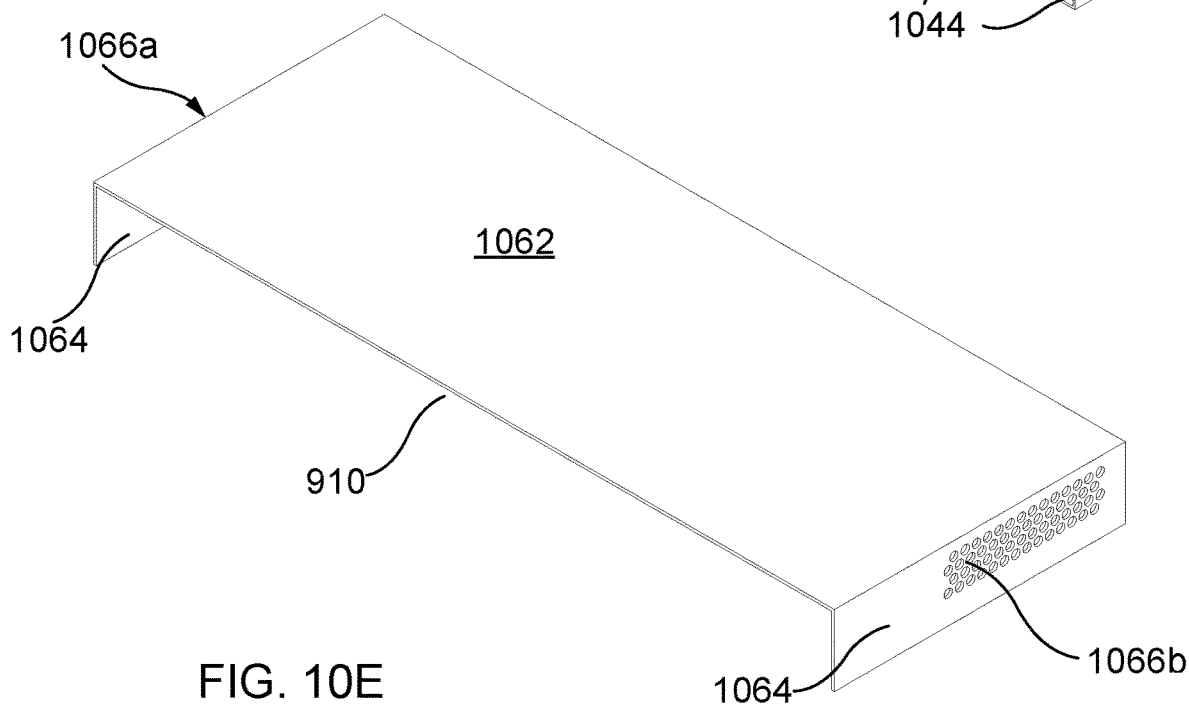

FIG. 10E shows a perspective view of an upper portion of the cooling apparatus of FIG. 9.

Figure 11A:
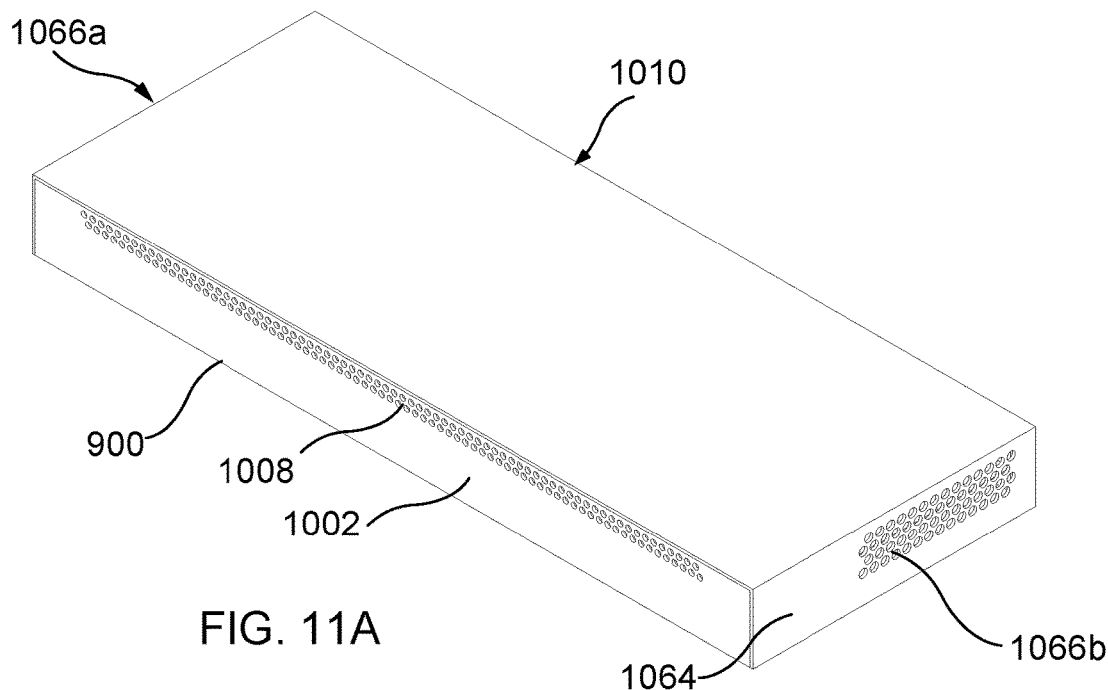

FIG. 11A shows a perspective view of the cooling apparatus of FIG. 9 as assembled.

Figure 11B:
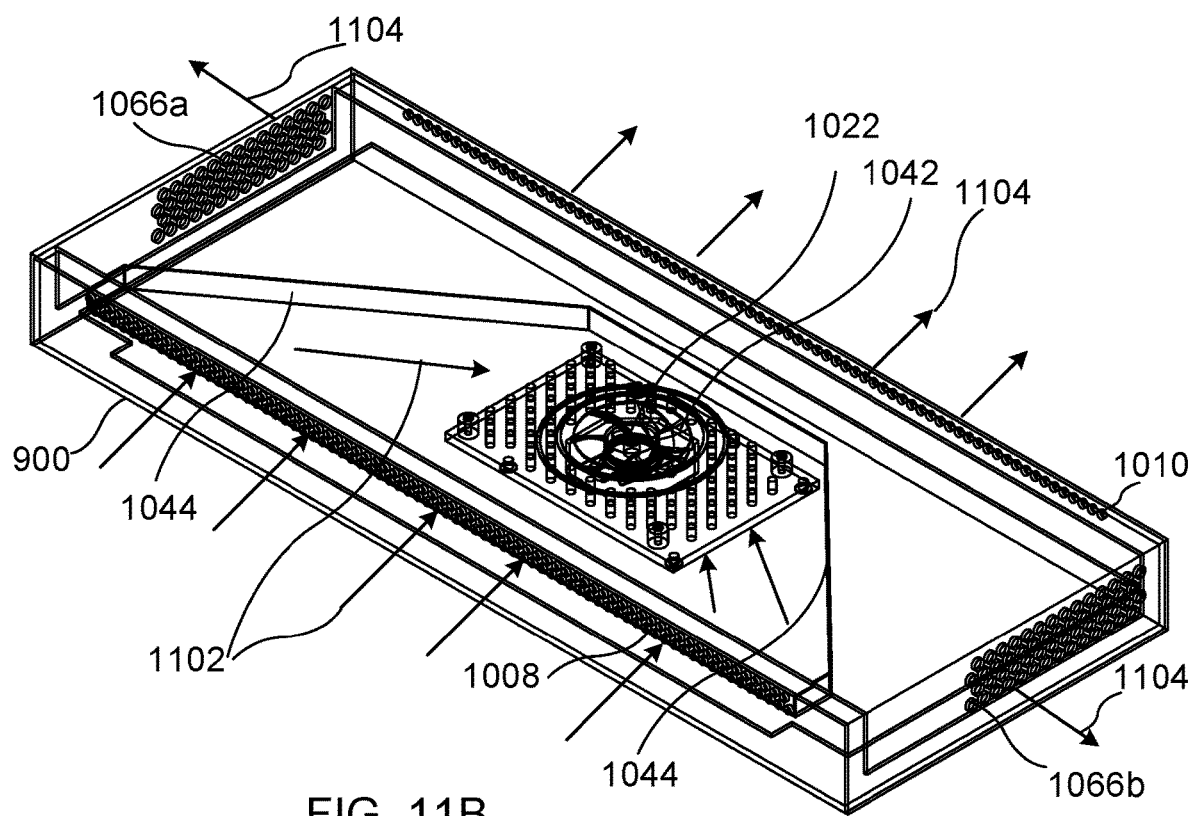

FIG. 11B shows a transparent perspective view of the cooling apparatus of FIG. 11A and depicting the airflow during operation thereof.

Figure 12:
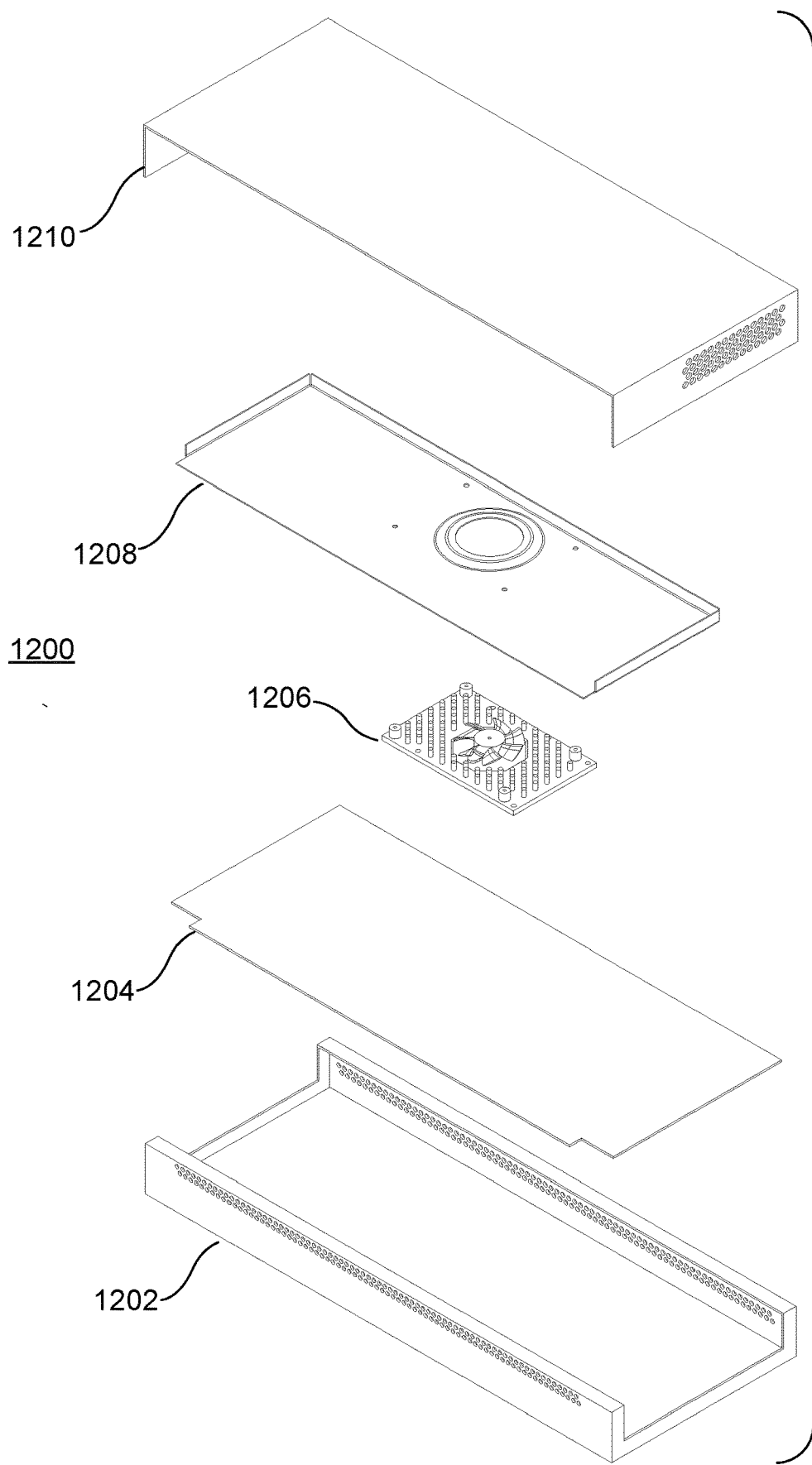

FIG. 12 shows an exploded perspective view of a housing of electronic circuitry in which a cooling apparatus has been implemented according to aspects of yet other embodiments.

Figure 13A:
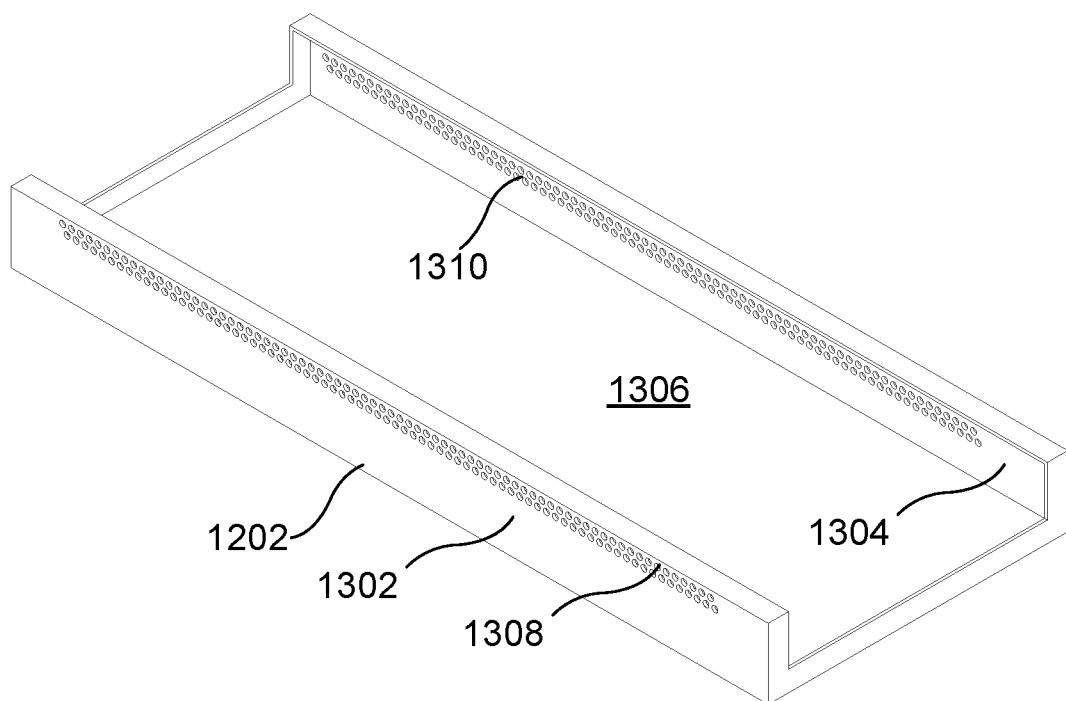

FIG. 13A shows a perspective view of a bottom portion of the cooling apparatus of FIG. 12.

Figure 13B:
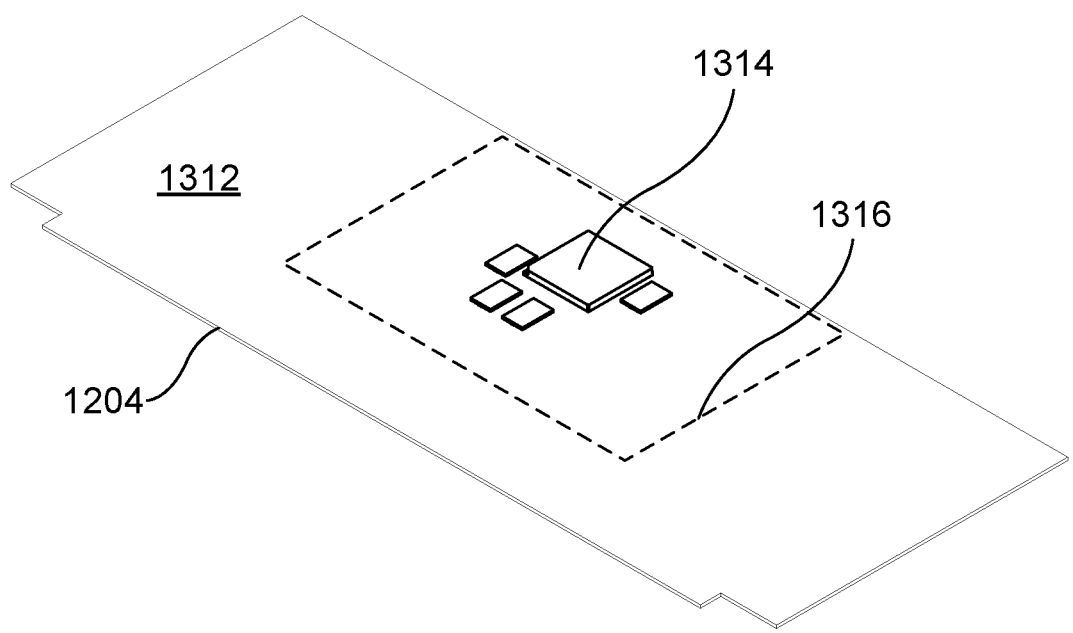

FIG. 13B shows a perspective view of an electronic printed circuit board disposed within the cooling apparatus of FIG. 12.

Figure 13C:
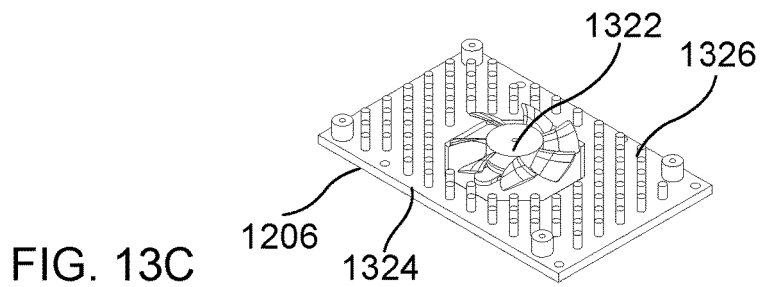

FIG. 13C shows a perspective view of a heat sink and cooling fan of the cooling apparatus of FIG. 12.

Figure 13D:
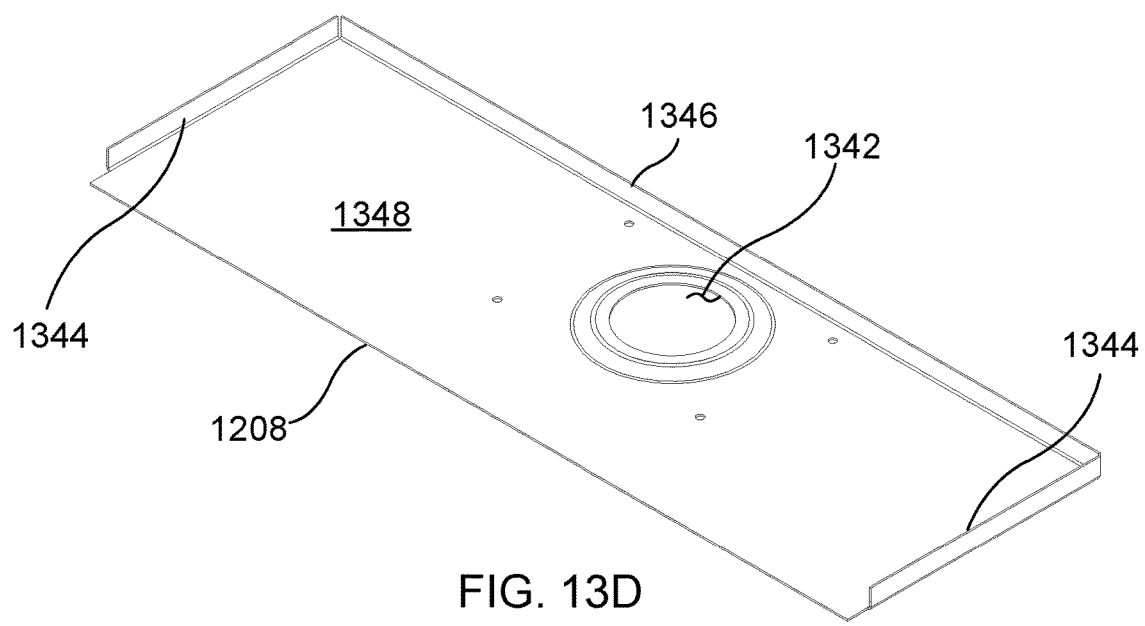

FIG. 13D shows a perspective view of an air plenum piece of the cooling apparatus of FIG. 12.

Figure 13E:
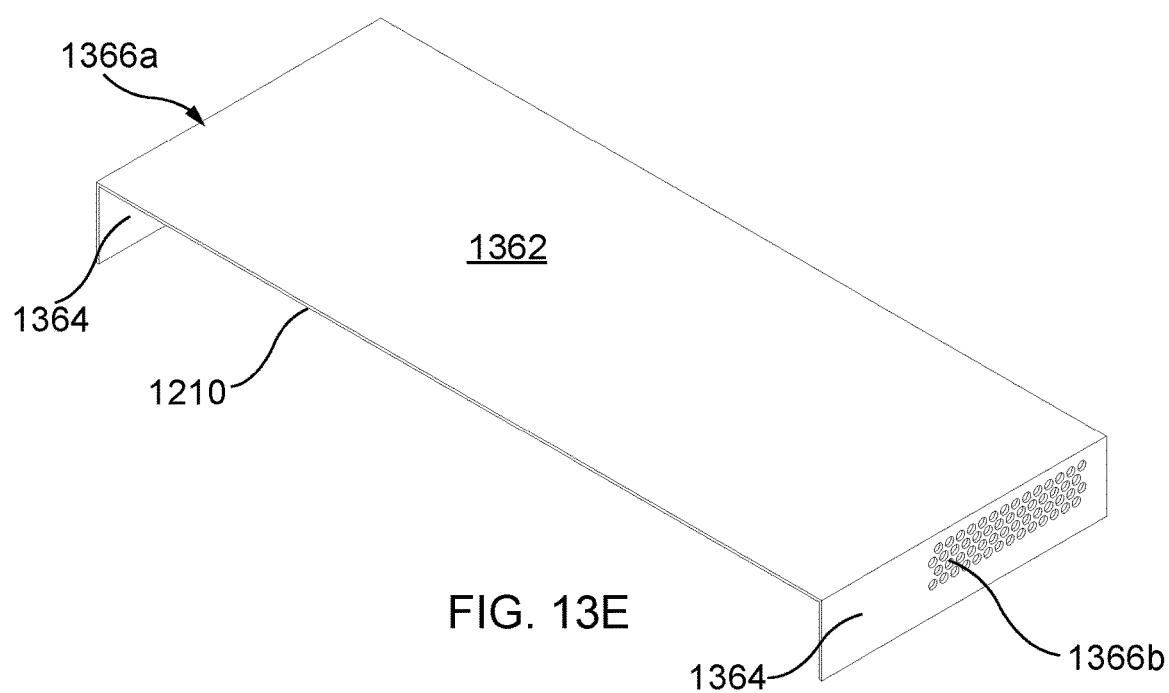

FIG. 13E shows a perspective view of an upper portion of the cooling apparatus of FIG. 12.

Figure 14A:
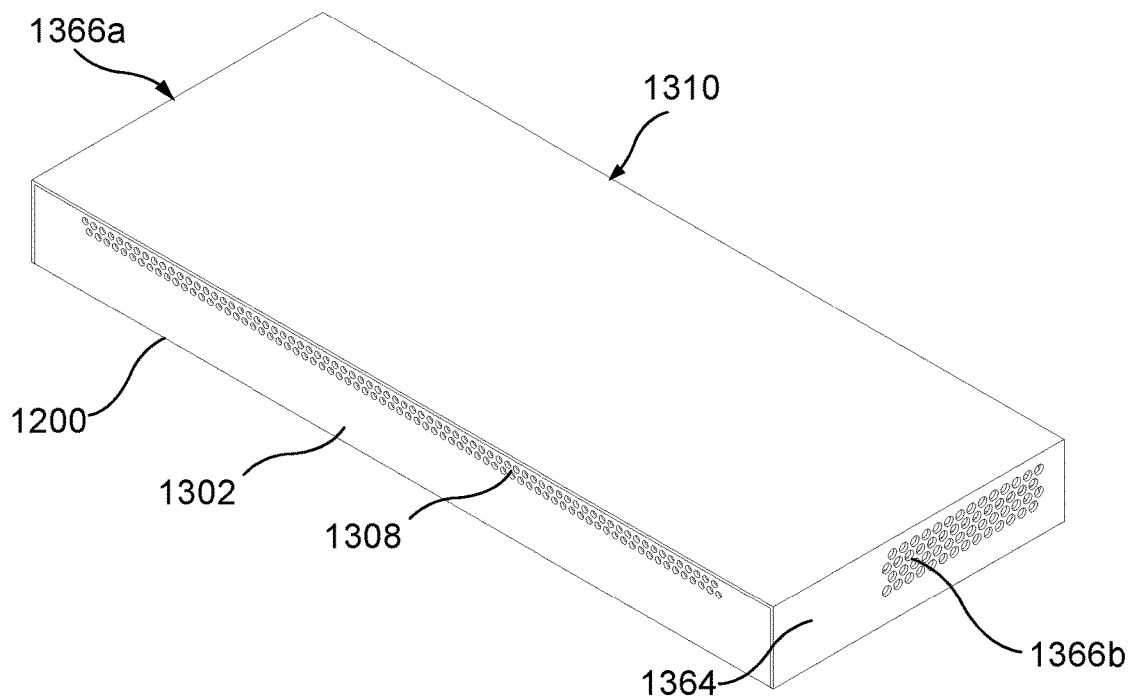

FIG. 14A shows a perspective view of the cooling apparatus of FIG. 12 as assembled.

Figure 14B:
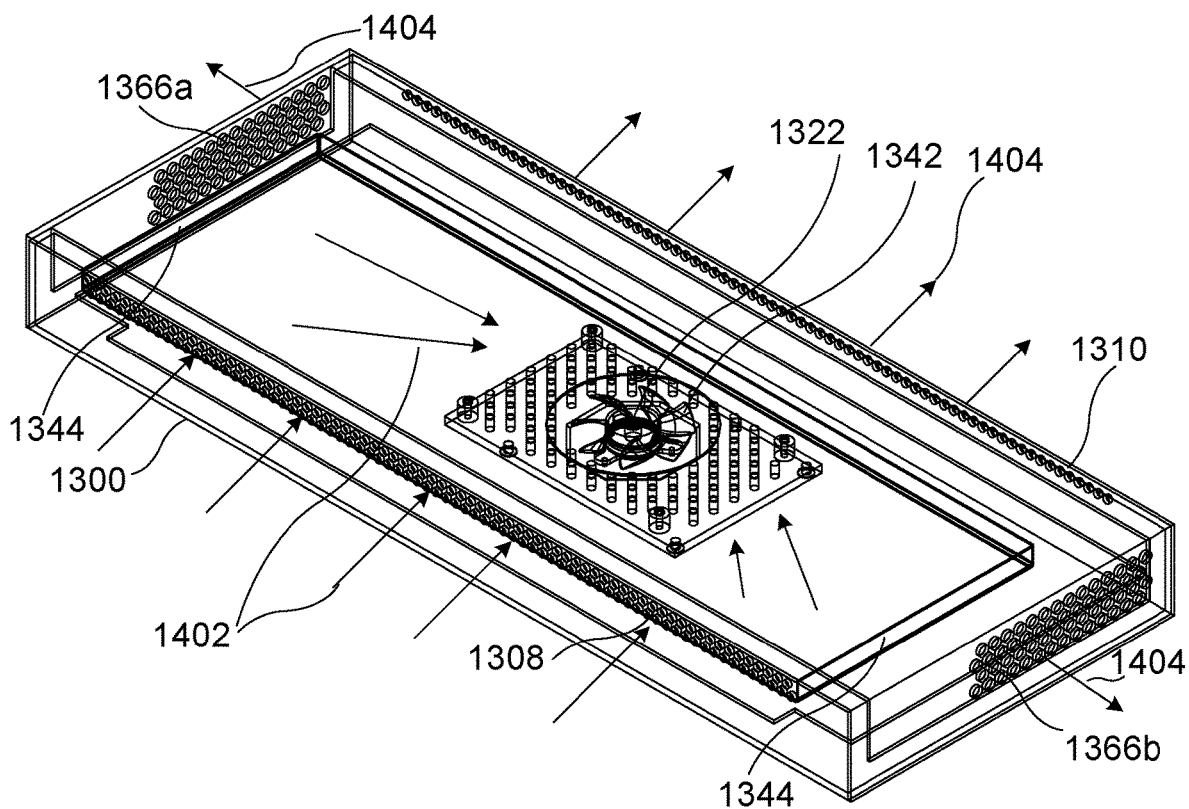

FIG. 14B shows a transparent perspective view of the cooling apparatus of FIG. 14A and depicting the airflow during operation thereof.

Figure 15:
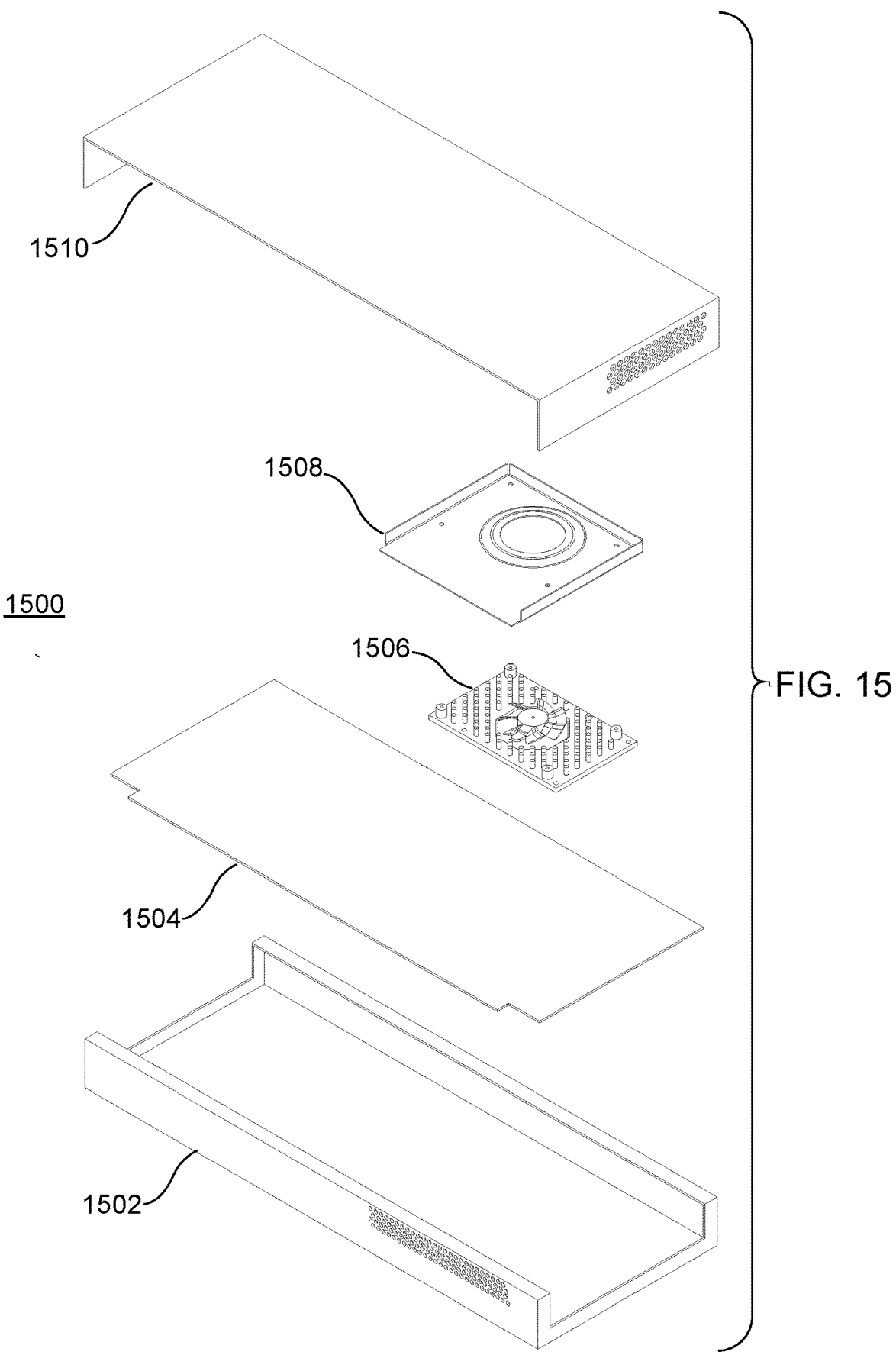

FIG. 15 shows an exploded perspective view of a housing of electronic circuitry in which a cooling apparatus has been implemented according to aspects of additional embodiments.

Figure 16A:
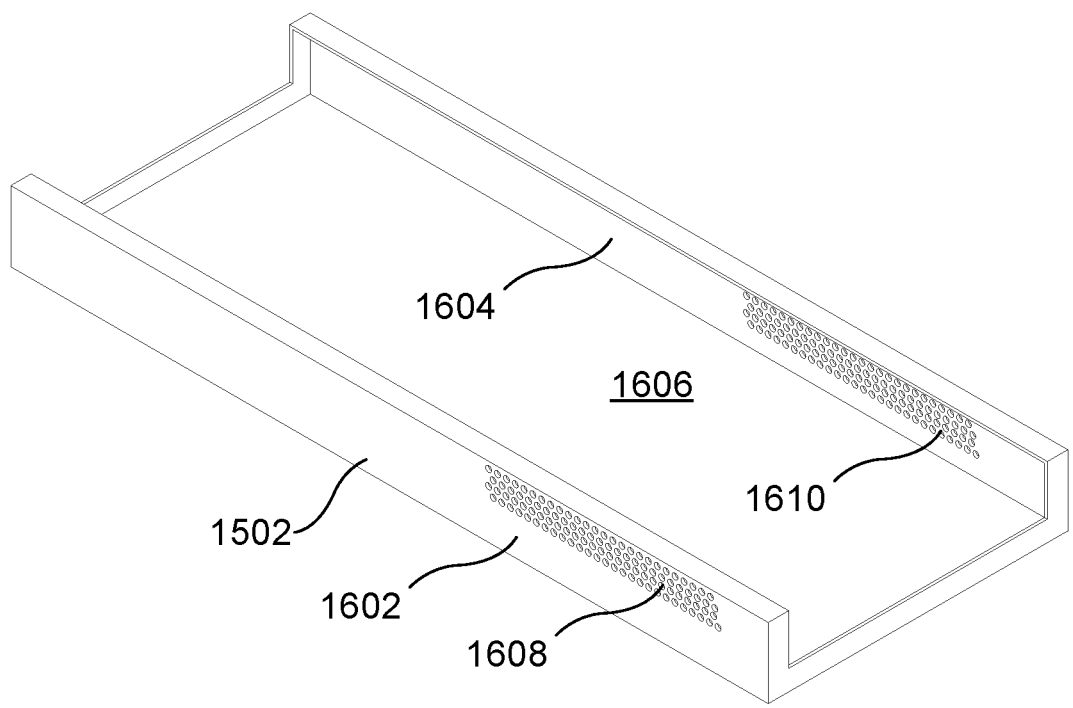

FIG. 16A shows a perspective view of a bottom portion of the cooling apparatus of FIG. 15.

Figure 16B:
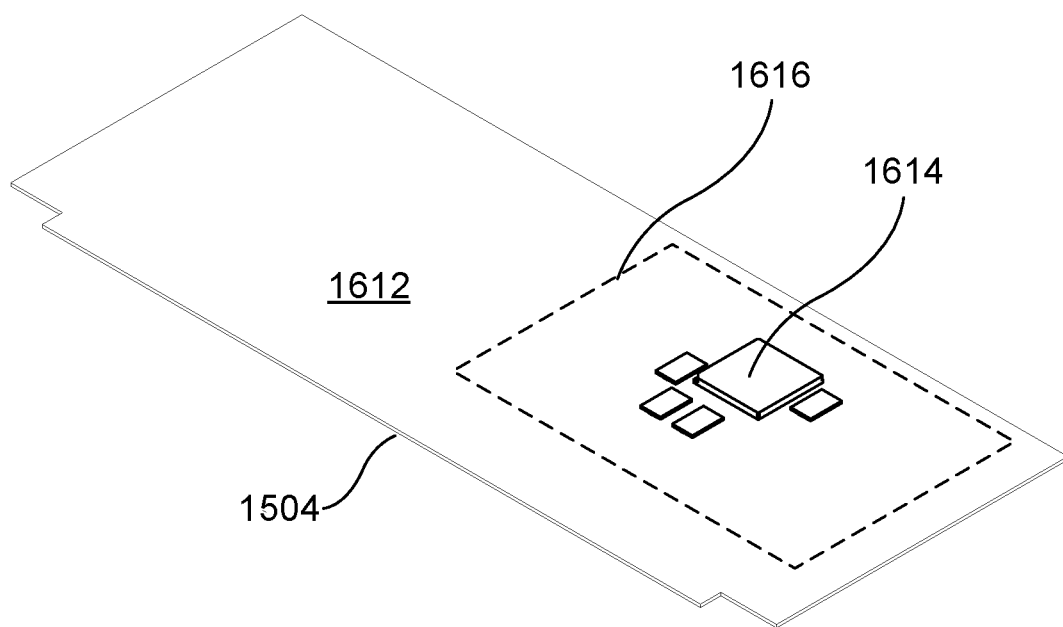

FIG. 16B shows a perspective view of an electronic printed circuit board disposed within the cooling apparatus of FIG. 15.

Figure 16C:
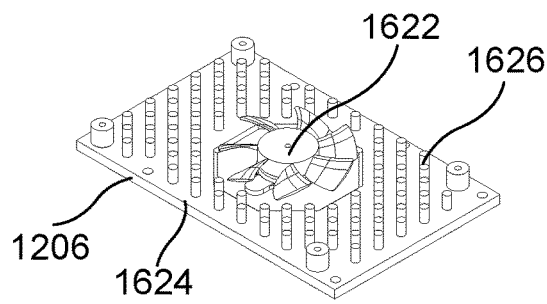

FIG. 16C shows a perspective view of a heat sink and cooling fan of the cooling apparatus of FIG. 15.

Figure 16D:
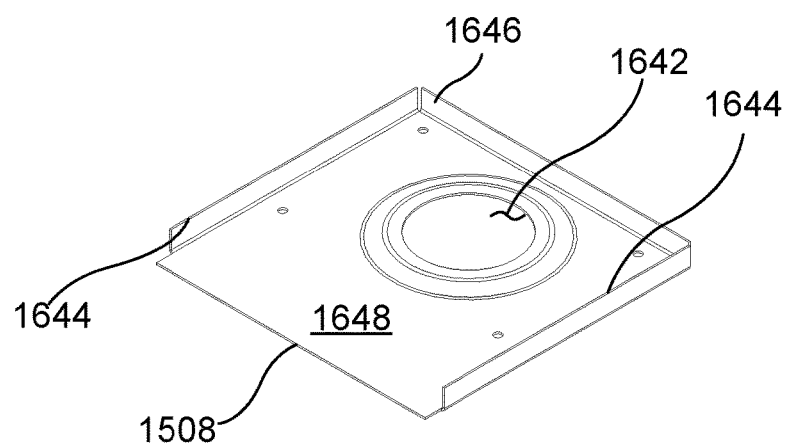

FIG. 16D shows a perspective view of an air plenum piece of the cooling apparatus of FIG. 15.

Figure 16E:
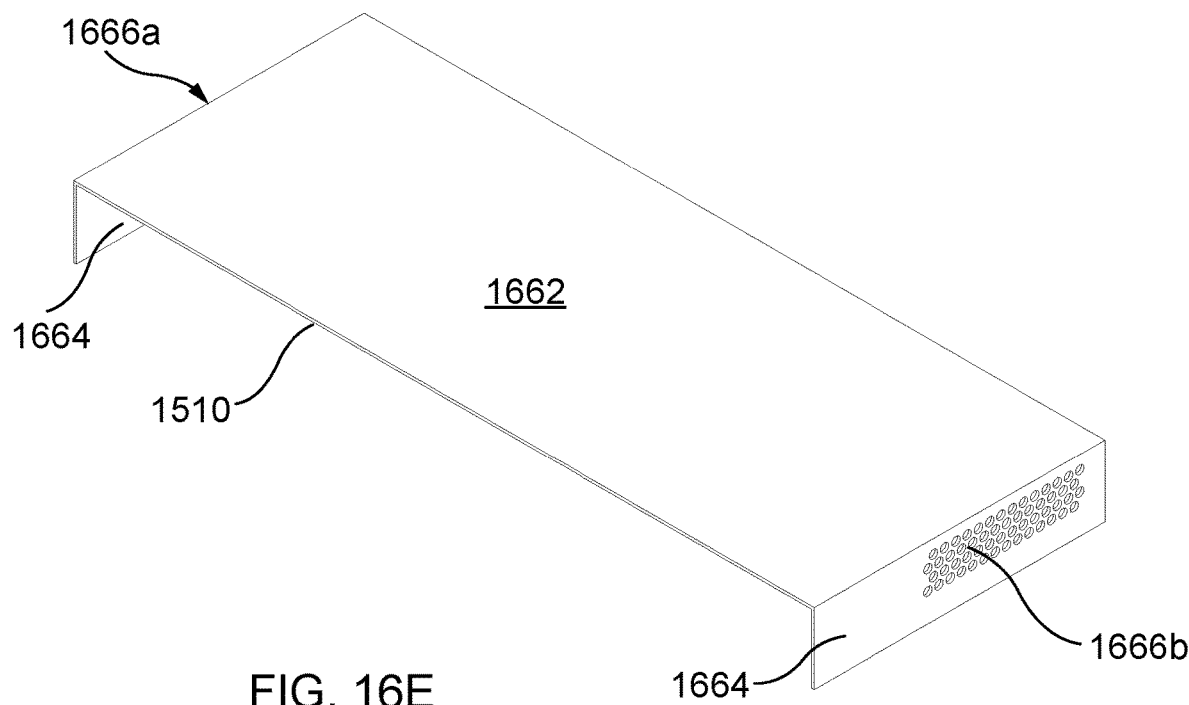

FIG. 16E shows a perspective view of an upper portion of the cooling apparatus of FIG. 15.

Figure 17A:
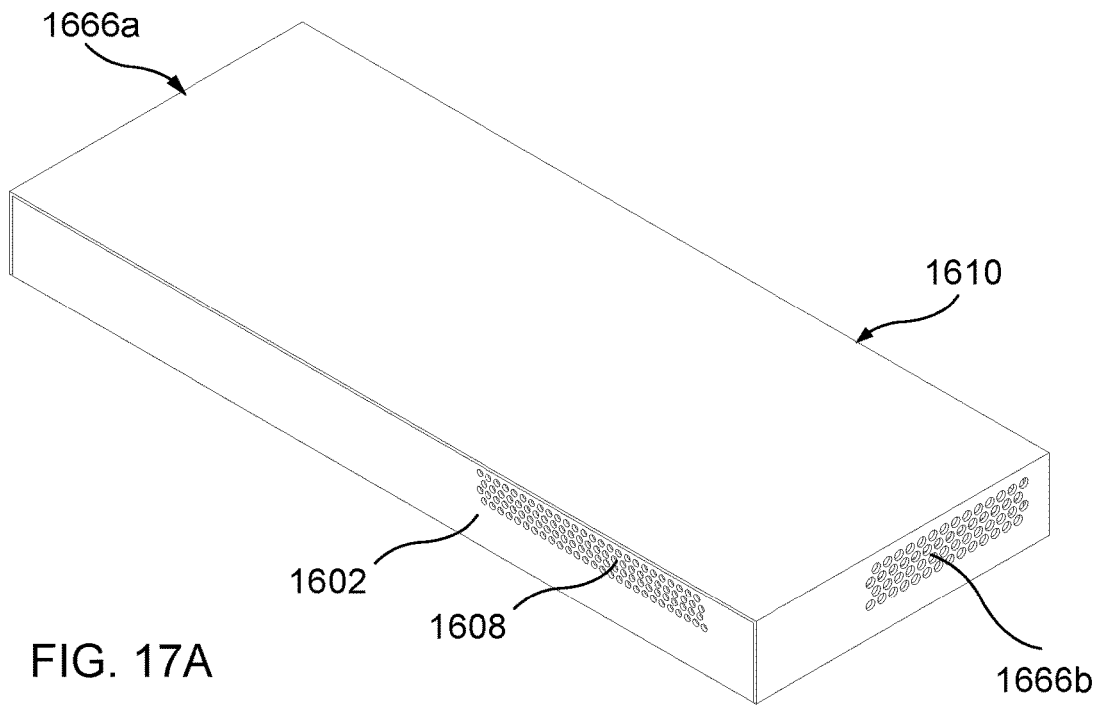

FIG. 17A shows a perspective view of the cooling apparatus of FIG. 15 as assembled.

Figure 17B:
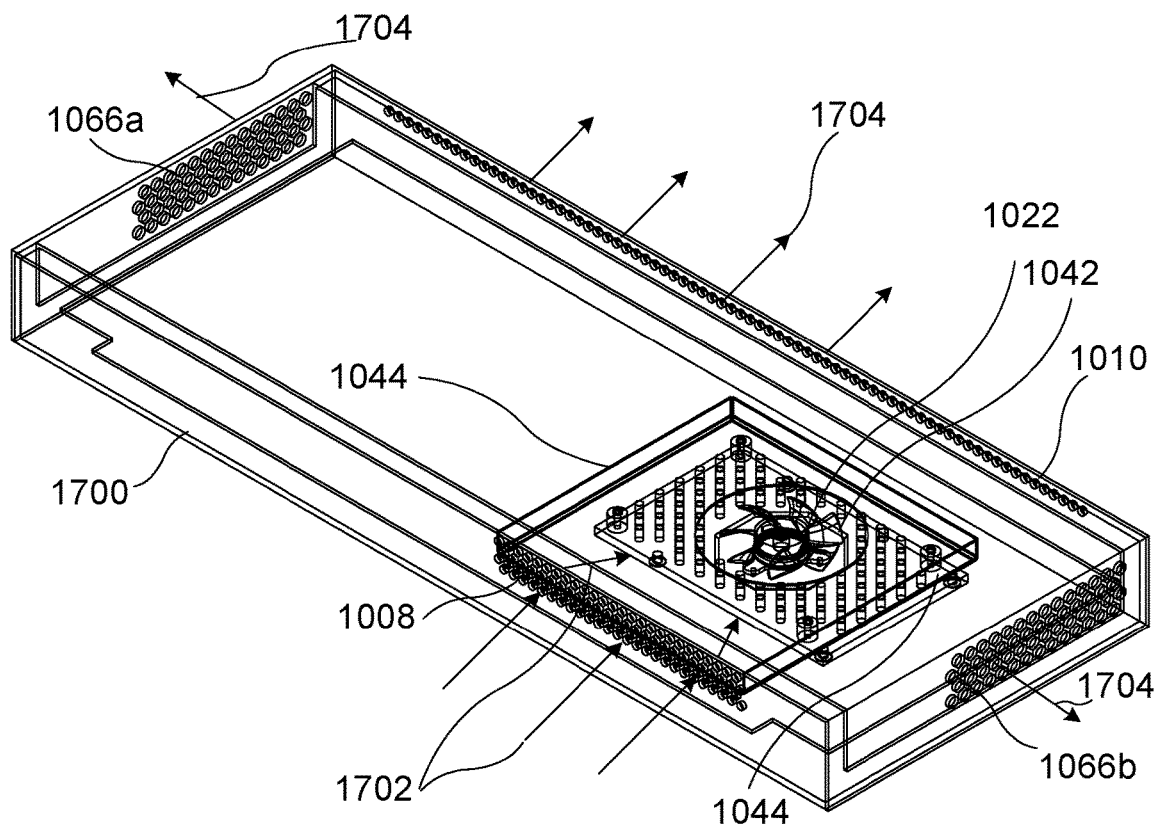

FIG. 17B shows a transparent perspective view of the cooling apparatus of FIG. 17A and depicting the airflow during operation thereof.

Figure 18:
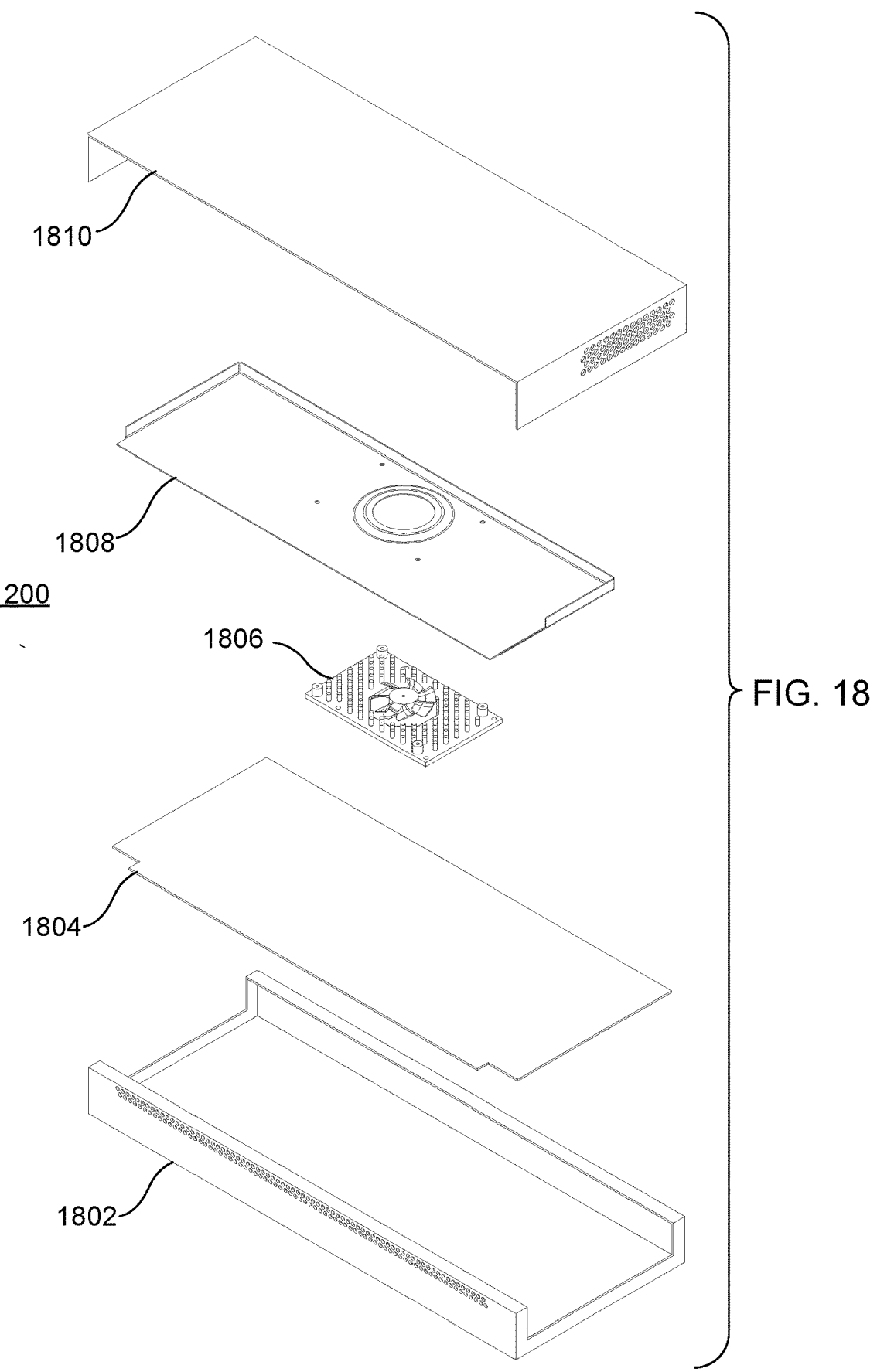

FIG. 18 shows an exploded perspective view of a housing of electronic circuitry in which a cooling apparatus has been implemented according to aspects of other embodiments.

Figure 19A:
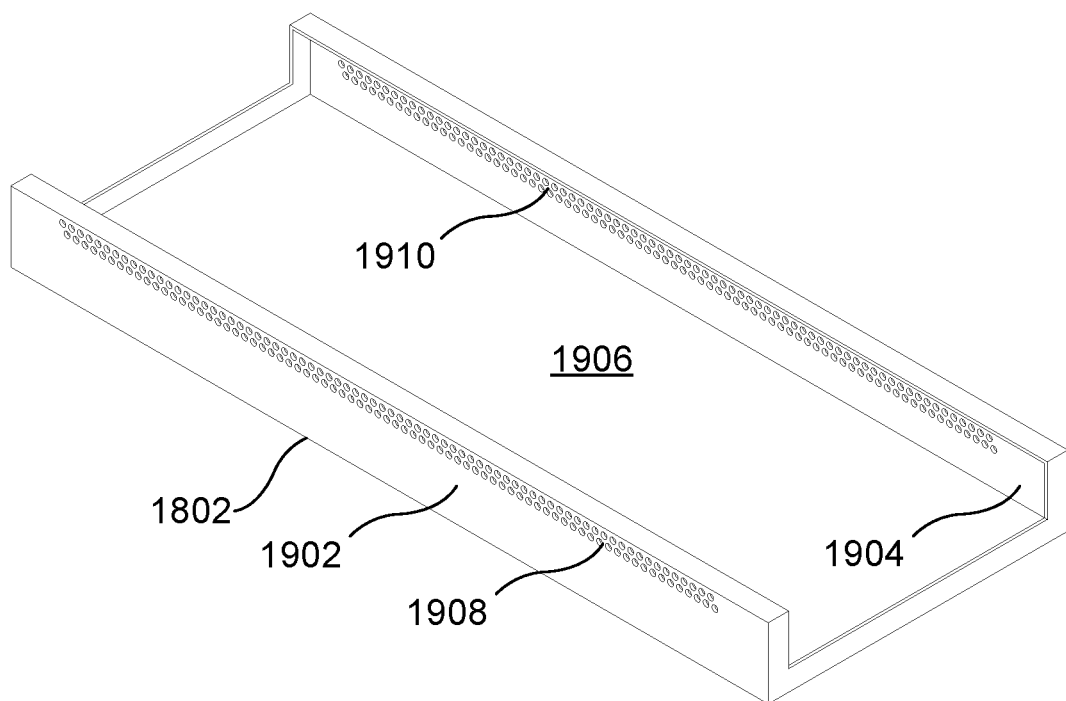

FIG. 19A shows a perspective view of a bottom portion of the cooling apparatus of FIG. 18.

Figure 19B:
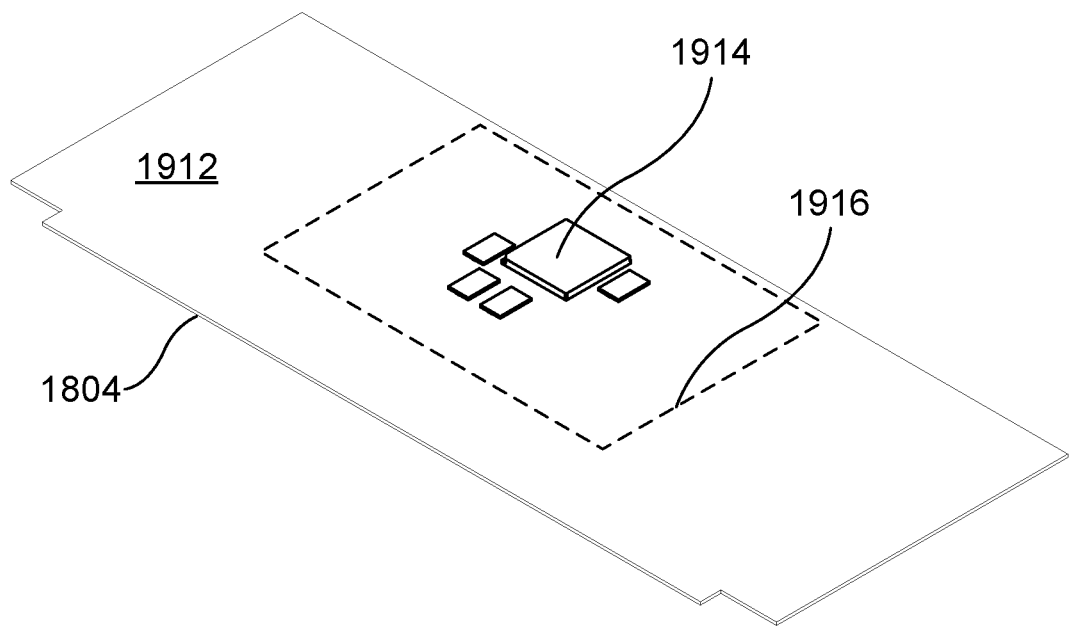

FIG. 19B shows a perspective view of an electronic printed circuit board disposed within the cooling apparatus of FIG. 18.

Figure 19C:
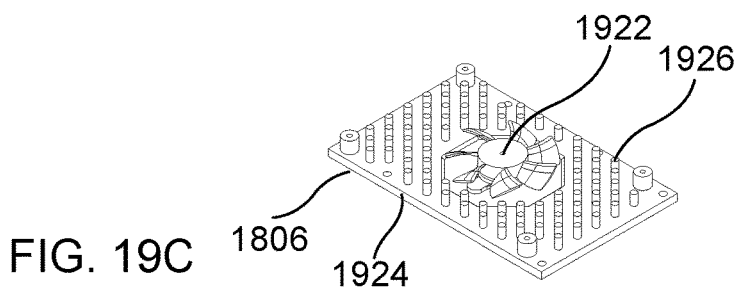

FIG. 19C shows a perspective view of a heat sink and cooling fan of the cooling apparatus of FIG. 18.

Figure 19D:
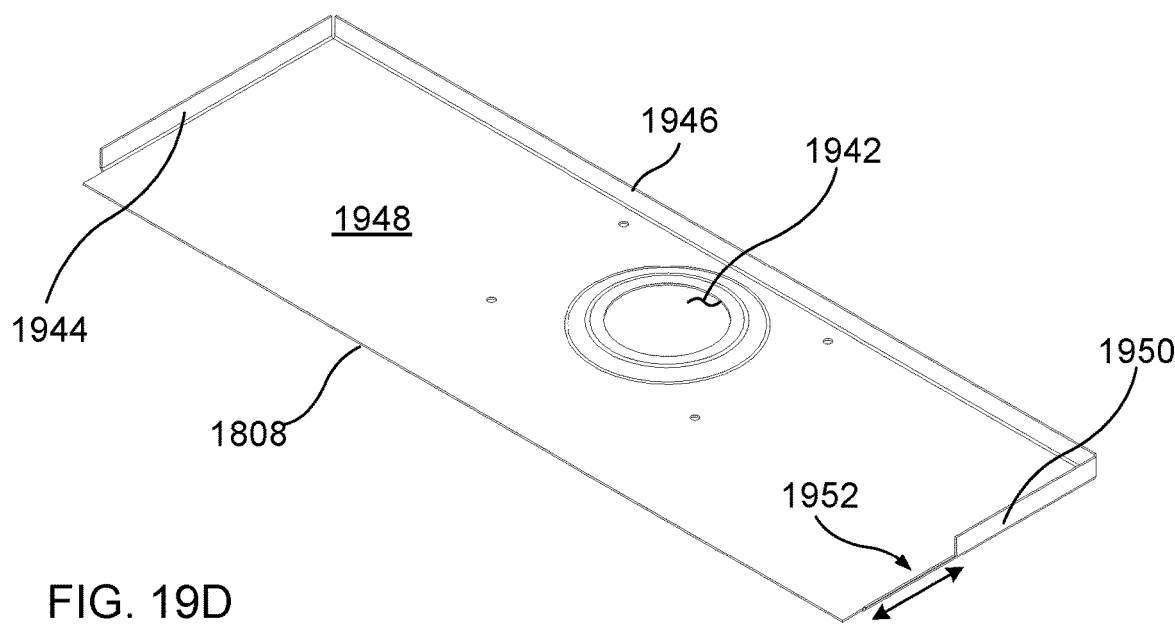

FIG. 19D shows a perspective view of an air plenum piece of the cooling apparatus of FIG. 18.

Figure 19E:
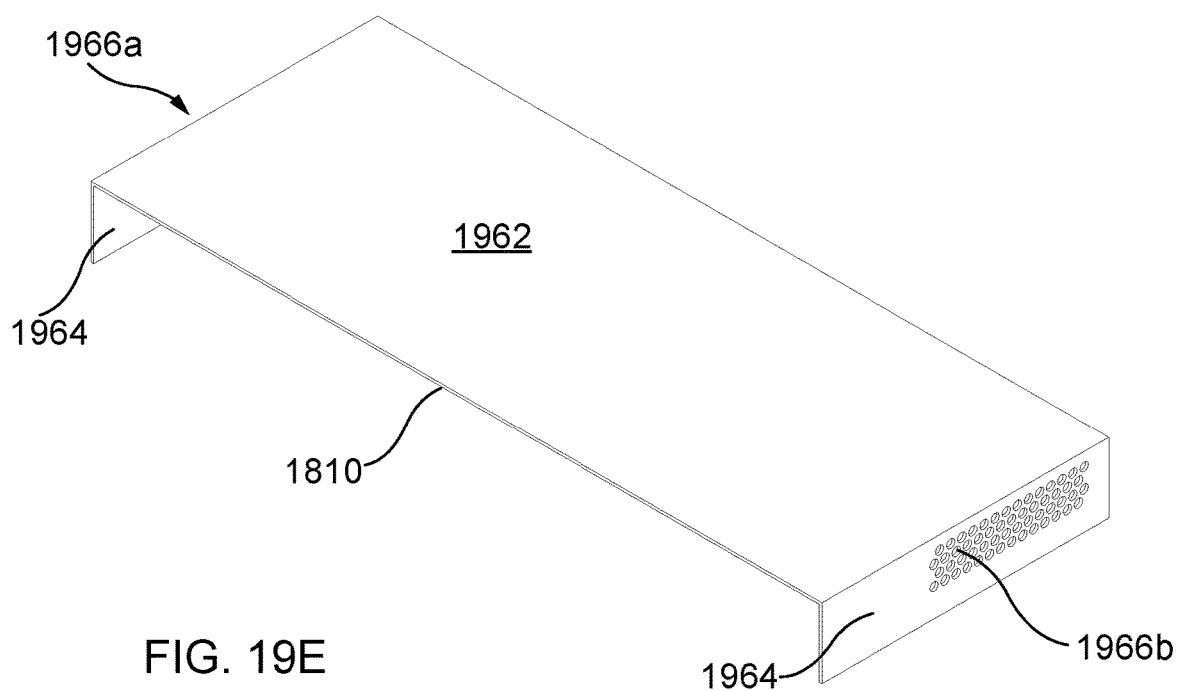

FIG. 19E shows a perspective view of an upper portion of the cooling apparatus of FIG. 18.

Figure 20A:
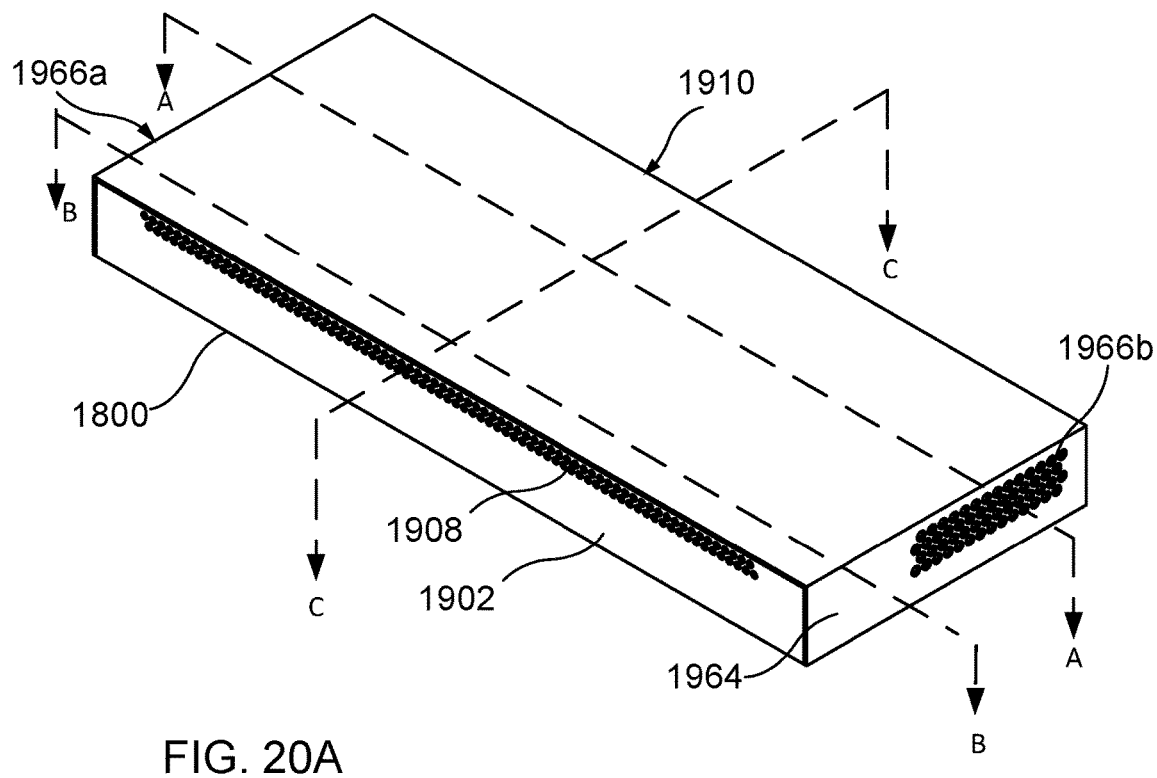

FIG. 20A shows a perspective view of the cooling apparatus of FIG. 18 as assembled.

Figure 20B:
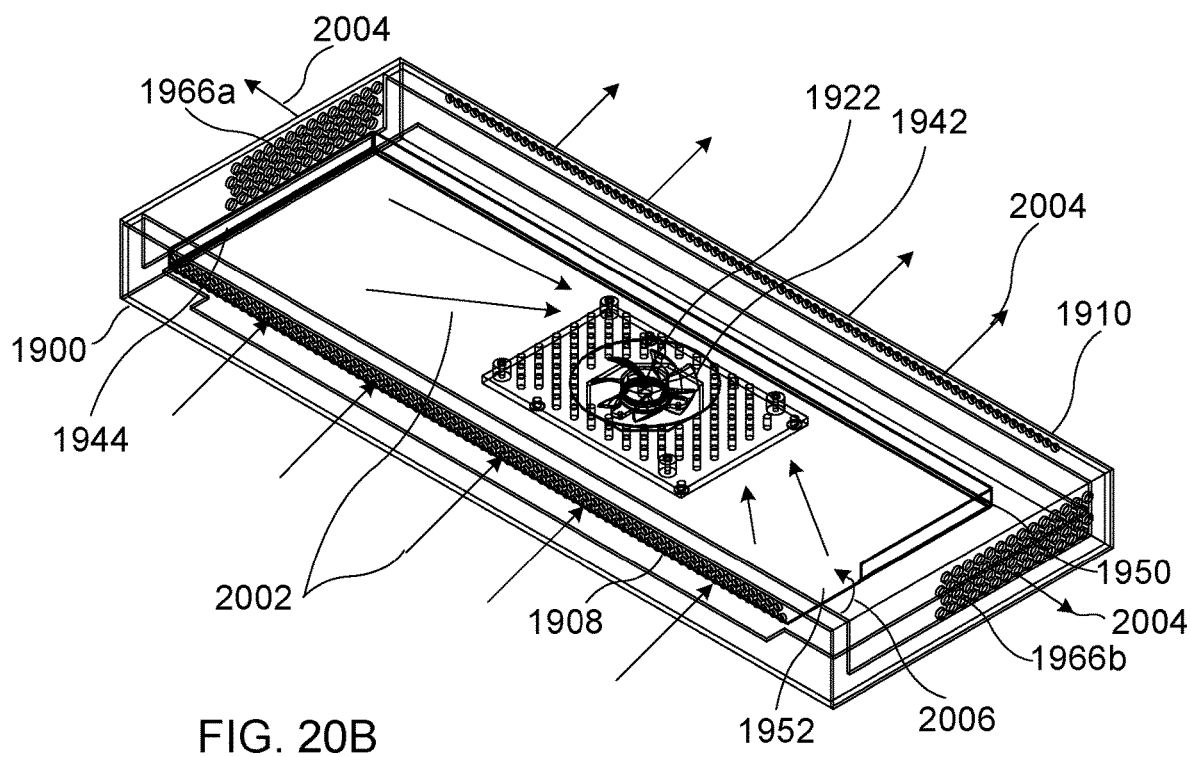

FIG. 20B shows a transparent perspective view of the cooling apparatus of FIG. 20A and depicting the airflow during operation thereof.

Figure 21A:
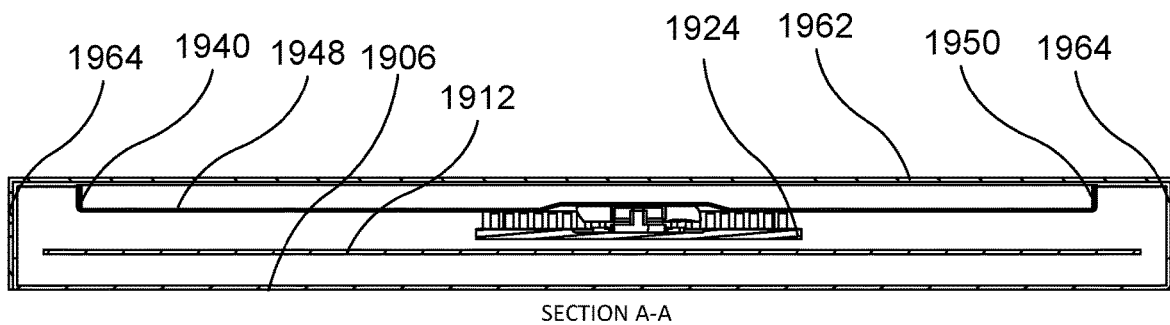

FIG. 21A shows a sectional view along line A-A of the cooling apparatus of FIG. 20A.

Figure 21B:
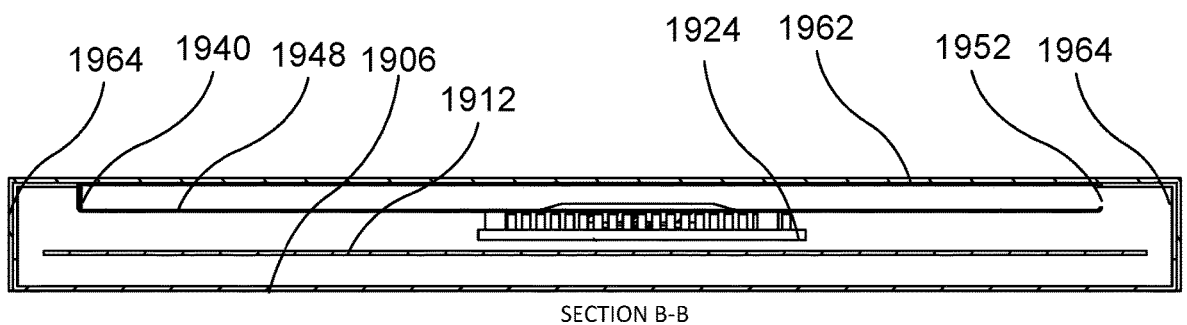

FIG. 21B shows a sectional view along line B-B of the cooling apparatus of FIG. 20A.

Figure 21C:
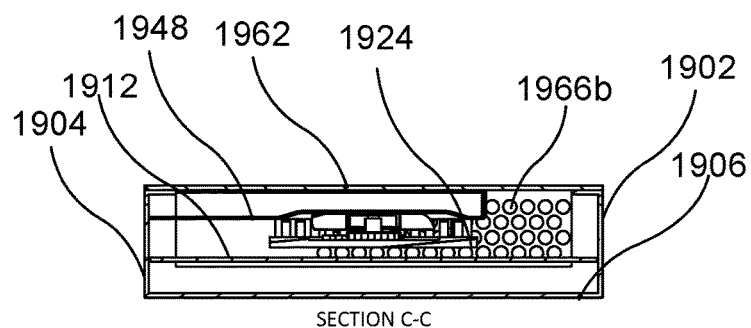

FIG. 21C shows a sectional view along line C-C of the cooling apparatus of FIG. 20A.

DETAILED DESCRIPTION OF THE INVENTION

The embodiments are described more fully hereinafter with reference to the accompanying drawings, in which aspects of the embodiments are shown. In the drawings, the size and relative sizes of layers and regions may be exaggerated for clarity. Like numbers refer to like elements throughout. The embodiments may, however, be embodied in many different forms and should not be construed as limited to the aspects of the embodiments set forth herein. Rather, these embodiments are provided so that this disclosure will be thorough and complete, and will fully convey the scope of the aspects of the embodiments to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices, such as audio electronic devices.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" on "in an embodiment" in various places throughout the specification is not necessarily referring to the same embodiment. Further, the particular feature, structures, or characteristics may be combined in any suitable manner in one or more embodiments.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

LIST OF REFERENCE NUMBERS FOR THE MAJOR ELEMENTS IN THE DRAWINGS

The following is a list of the major elements in the drawings in numerical order.
100 Electronic Circuity Cooling Apparatus (Cooling Apparatus)
102 Lower Portion
104 Circuit Board with Cooling Fan (Circuit Board)
106 Air Plenum Piece (APP)
108 Upper Portion
202 Cooler Intake Air
204 Warmer Output Air
302 Rear Air Inlet
304 Rear Panel
306 Bottom Panel
402 Fan
404 Heat Sink
406 Circuitry
502 Air Plenum Hole (Hole)
504 Horizontal Surface
506 Vertical Wall
508 Plenum Planar Portion
510 Plenum Air Channel
512 Assembly Holes 602 Top Air Inlet
604 Front Air Inlet
606 Side Air Exhaust
608 Assembly Screws
610 Front Panel
612 Left Side Panel
614 Right Side Panel
616 Upper Panel
700 Electronic Circuity Cooling Apparatus (Cooling Apparatus)
702 Lower Portion
704 Circuit Board
706 Heat Sink with Cooling Fan (Heat Sink)
708 Air Plenum Piece (APP)
710 Upper Portion
802 Rear Air Inlet
804 Rear Panel
806 Bottom Panel
812 Circuit Board Surface
814 Circuitry
816 Heat Sink Footprint
822 Fan
824 Lower Horizontal Portion
826 Vertical Wall
828 Upper Horizontal Portion
830 Pin Array
842 Air Plenum Hole (Hole)
846 Vertical Wall
848 Plenum Planar Portion
850 Plenum Air Channel
862 Top Air Inlet
864 Front Air Inlet
866 Side Air Exhaust
868 Assembly Screws
870 Front Panel
872 Left Side Panel
874 Right Side Panel
876 Upper Panel
900 Electronic Circuity Cooling Apparatus (Cooling Apparatus)
902 Lower Portion
904 Circuit Board
906 Heat Sink with Cooling Fan (Heat Sink)
908 Air Plenum Piece (APP)
910 Upper Portion
1002 Front Panel
1004 Rear Panel
1006 Bottom Panel
1008 Front Air Inlet Openings
1010 Rear Air Outlet Openings
1012 Circuit Board Surface
1014 Circuitry
1016 Heat Sink Footprint
1022 Fan
1024 Heat Sink Panel
1026 Pin Array
1042 Plenum Air Hole
1044 Plenum Side Vertical Tab
1046 Plenum Rear Vertical Tab
1048 Plenum Planar Portion
1062 Top Panel
1064 Side Panel
1066a Side Air Outlet Openings
1066b Side Air Outlet Openings
1102 Cooling Air Stream
1104 Exhaust Air Stream
1200 Electronic Circuity Cooling Apparatus (Cooling Apparatus)
1202 Lower Portion
1204 Circuit Board
1206 Heat Sink with Cooling Fan (Heat Sink)
1208 Air Plenum Piece (APP)
1210 Upper Portion
1302 Front Panel
1304 Rear Panel
1306 Bottom Panel
1308 Front Air Inlet Openings
1310 Rear Air Outlet Openings
1312 Circuit Board Surface
1314 Circuitry
1316 Heat Sink Footprint
1322 Fan
1324 Heat Sink Panel
1326 Pin Array
1342 Plenum Air Hole
1344 Plenum Side Vertical Tab
1346 Plenum Rear Vertical Tab
1348 Plenum Planar Portion
1362 Top Panel
1364 Side Panel
1366a Side Air Outlet Openings
1366b Side Air Outlet Openings
1402 Cooling Air Stream
1404 Exhaust Air Stream
1500 Electronic Circuity Cooling Apparatus (Cooling Apparatus)
1502 Lower Portion
1504 Circuit Board
1506 Heat Sink with Cooling Fan (Heat Sink)
1508 Air Plenum Piece (APP)
1510 Upper Portion
1602 Front Panel
1604 Rear Panel
1606 Bottom Panel
1608 Front Air Inlet Openings
1610 Rear Air Outlet Openings
1612 Circuit Board Surface
1614 Circuitry
1616 Heat Sink Footprint
1622 Fan
1624 Heat Sink Panel
1626 Pin Array
1642 Plenum Air Hole
1644 Plenum Side Vertical Tab
1646 Plenum Rear Vertical Tab
1648 Plenum Planar Portion
1662 Top Panel
1664 Side Panel
1666a Side Air Outlet Openings
1666b Side Air Outlet Openings
1702 Cooling Air Stream
1704 Exhaust Air Stream
1800 Electronic Circuity Cooling Apparatus (Cooling Apparatus)
1802 Lower Portion
1804 Circuit Board
1806 Heat Sink with Cooling Fan (Heat Sink)
1808 Air Plenum Piece (APP)
1810 Upper Portion
1902 Front Panel
1904 Rear Panel
1906 Bottom Panel
1908 Front Air Inlet Openings 1910 Rear Air Outlet Openings
1912 Circuit Board Surface
1914 Circuitry
1916 Heat Sink Footprint
1922 Fan
1924 Heat Sink Panel
1926 Pin Array
1942 Plenum Air Hole
1944 Plenum Left Side Vertical Tab
1946 Plenum Rear Vertical Tab
1948 Plenum Planar Portion
1950 Plenum Right Side Vertical Tab
1952 Plenum Right Side Cut-Away Portion
1962 Top Panel
1964 Side Panel
1966a Side Air Outlet Openings
1966b Side Air Outlet Openings
2002 Cooling Air Stream
2004 Exhaust Air Stream
2006 Recirculated Air Stream List of Acronyms Used in the Specification in Alphabetical Order The following is a list of the acronyms used in the specification in alphabetical order.
APP Air Plenum Piece

MODE(S) FOR CARRYING OUT THE INVENTION

The different aspects of the embodiments described herein pertain to the context of a cooling system for audio electronics, but is not limited thereto, except as may be set forth expressly in the appended claims.

For 40 years Creston® Electronics Inc., has been the world's leading manufacturer of advanced control and automation systems, innovating technology to simplify and enhance modern lifestyles and businesses. Crestron® designs, manufactures, and offers for sale integrated solutions to control audio, video, computer, and environmental systems. In addition, the devices and systems offered by Crestron® streamlines technology, improving the quality of life in commercial buildings, universities, hotels, hospitals, and homes, among other locations. Accordingly, the systems, methods, and modes of the aspects of the embodiments described herein, as embodied as digital media products such as DM-TX-4K-1000-SFP (4K transmitter) and DM-RX-4K-1000-SFP (4K receiver), can be manufactured by Crestron® Electronics Inc., located in Rockleigh, N.J., and have been marketed and sold under the registered trademark name of "DigitalMedia™".

FIG. 1 illustrates an exploded perspective view of a housing of electronic circuitry in which a cooling apparatus has been implemented according to aspects of the embodiments. According to aspects of the embodiments, components of cooling apparatus 100 include both extraneous components, and the manner in which they have been implemented in design, but also intrinsic components, such as components of the housing assembly itself. This combination of devices will be described in greater detail below.

Electronic circuitry cooling apparatus (cooling apparatus) 100 comprises lower portion 102, circuit board with cooling fan (circuit board) 104, air plenum piece (APP) 106, and upper portion 108.

As shown in FIG. 3, which illustrates a perspective view of bottom portion 102 of cooling apparatus 100, lower portion 102 comprises rear air inlet 302, which is located on rear panel 304, and further comprises bottom panel 306 according to aspects of the embodiments.

Shown in FIG. 4 is circuit board 104, which itself comprises cooling fan 402 located on top of heat sink 404 and circuitry 406, which is configured and arranged in a manner well known to those of skill in the art, and thus, in fulfillment of the dual purposes of clarity and brevity, a detailed discussion thereof has been omitted from herein.

FIG. 5A illustrates air plenum piece 106, which comprises plenum planar portion 508, vertical tabs 506a,b, horizontal tabs 504a,b, and air plenum hole 502, located on plenum planar portion 508. In addition, air plenum piece 106 further comprises a plurality of mounting holes 512. air plenum piece 106 is adapted and shaped in the form of an elongated channel, and as such comprises channel 510 that includes a channel width and a channel length according to aspects of the embodiments.

FIG. 6 illustrates upper portion 108, which comprises front panel 610, left side panel 612, right side panel 614, and upper panel 616. In addition, front panel 610 comprises front air inlets 604, left side panel 612 comprises side air exhaust 606a, and right side panel 614 comprises side air exhaust 606b according to aspects of the embodiments. Further, top portion 616 comprises top air inlet 602 according to aspects of the embodiments.

Described in several of the drawings are the nomenclatures that indicate relative position of "front," "rear," "side," "top," "bottom," and other such similar indicators of relative position. As those of skill in the art can appreciate, such indicators are not to be taken in a limiting sense, and are merely provided to make the discussion and description of the aspects of the embodiments spatially easier to understand, and to place pieces or components thereof in spatial or relative context with each other.

Attention is now directed to FIGS. 1, 2A, 2B, 5A, 5B, and 6. According to aspects of the embodiments, cooler intake air (intake air) 202 is drawn in from top air inlet 602, front air inlet 604, and rear air inlet 302 by operation of fan 402. As intake air 202 is drawn in, it is forced to travel on top of air plenum piece 106, because, as shown in FIGS. 1, 2A, 2B, and 5A, air plenum piece 106 has been designed and fabricated to substantially enclose the air intakes, separate them from the lower portion of the housing enclosure, and provide only one path for intake air 202 to travel as it is pulled in by fan 402; that is, air plenum piece 106 substantially seals the upper portion of the interior of the housing from the lower portion (anything below air plenum piece 106), which includes circuit board 104 and the upper surface of lower portion 102. Further, since all air intake holes (302, 602, 604) are located in that space that is defined by the upper level of air plenum piece 106 and the interior lower surface of upper portion 108, intake air 202 travels through channel 510 to hole 502 and fan 402, via operation of fan 402.

Intake air 202 is pulled through rear air inlet 302, top air inlet 602, and front air inlet 604, and then through hole 502 by fan 402, wherein it passes over and through heat sink 404 and circuitry 406 located on circuit board 104. As the air is expelled from fan 402 and passes over heat sink 404 and circuitry 406, it picks up heat, and becomes or transitions to warmer output air (output air) 204. Output air 204 is forced to be expelled through side air exhausts 606a,b according to aspects of the embodiments, as they are the only exhausts available for the warmer air to travel according to aspects of the embodiments.

According to aspects of the embodiments, air duct conduit system (cooling apparatus) 100 has been created such that air can be ducted to fan 402 from multiple air inlets 302, 602, 604. Air exhaust vents 606a,b are located on the left and right side walls 612, 614, respectively. Having a plurality of surfaces with inlets 302, 602, 604 substantially prevents the possibility of over-heating due to blocked air inlets according to aspects of the embodiments. Air plenum piece 106 contains a suitably sized hole 502 that is about the size of the diameter of the fan blades, and is spaced in close proximity to the fan blades. In addition, air plenum piece 106 is sized and located such that it leaves a very small gap between air plenum piece 106 and the front and rear walls, so that air is drawn from the top surface 616, and front and rear walls 610, 304 according to aspects of the embodiments. According to further aspects of the embodiments, air plenum piece 106 of this configuration also reduces the amount of fan noise radiated from the container because the fan is located farther away from the exterior surface, and the intake air has a longer distance to travel prior to encountering the blades of fan 402; as those of skill in the art can appreciate, air intakes that are located relatively closer to the blades of a fan create more noise than when air intakes are located relatively farther away from the blades of the fan. Further, cooler intake air 202 is pulled in from multiple and larger 602, 604, 302 surfaces that further reduces the acoustic noise generated by the fan as those skilled in the art can appreciate. According to still further aspects of the embodiments, locating fan 402 farther away from inlets 302, 602, 604 lowers the pressure drop through the same inlets 302, 602, 604, which can be increased to accommodate greater cooling capacity; thus, more heat can be removed with a smaller fan than would otherwise be the case.

Attention is again directed to FIG. 5A, which illustrates a perspective view of air plenum piece 106 used in cooling apparatus 100 of FIGS. 1 and 2 according to aspects of the embodiments, and FIG. 5B, which illustrates a side view of air plenum piece 106 used in the cooling apparatus of FIGS. 1 and 2 according to aspects of the embodiments. As shown in FIGS. 5A and 5B, air plenum piece 106 comprises a substantially planar portion (plenum planar portion) 508, within which is located hole 502. Hole 502 is sized to be substantially similar in diameter to the diameter of the blades of fan 402, which, according to aspects of the embodiments, is located substantially coaxially in alignment with hole 502 (e.g., an imaginary line drawn through the center of hole 502 and the center of the fan blades would be substantially parallel and co-located in space and perpendicular to fan 402 and hole 502). On both sides of plenum planar portion 508 are located respective substantially vertical walls (walls) 506a,b, which form plenum air channel 510.

Plenum air channel 510 is the three dimensional space through which intake air 202 travels to get to hole 502 and fan 402. Plenum air channel 510 is formed not only by walls 506a,b, but also by rear panel 304 (FIG. 3; of lower portion 102) and front panel 610 (FIG. 6; of upper portion 108), according to aspects of the embodiments. According to aspects of the embodiments, it is the creation of plenum air channel 510 that causes the cool intake air 202 to be drawn into hole 502 by fan 402. As shown in FIGS. 5A and 5B, channel 510 has a length and width; due to the design and fabrication thereof, the channel length is approximately the interior linear distance from front panel 610 to rear panel 304 according to aspects of the embodiments. The channel width is the linear distance between first vertical wall 506a and second vertical wall 506b, as shown in FIG. 5B, according to aspects of the embodiments. The volume of channel 510 is defined by the product of the channel length, channel width, and channel depth (which is the height of vertical walls 506a,b), and has been sized to accommodate the amount of air that can be drawn in by fan 402 and required to maintain an adequate rate of cooling (or rate of heat dissipation) of the electronic circuitry located on circuit board 104.

FIG. 6 illustrates a perspective view of upper portion 108 of cooling apparatus 100 of FIGS. 1 and 2 according to aspects of the embodiments. As shown in FIG. 6, upper portion 108 comprises all but one of the sections of air intake and air exhaust holes. Upper portion 108 comprises top air inlet 602 (located on upper panel 616), front air inlet 604 (located on front panel 610), side air exhaust 606a (located on left side panel 612), and side air exhaust 606b (located on right side panel 614). While rear air inlet 302 is shown as being located on lower portion 102, those of skill in the art can appreciate that upper portion 108 could have been fabricated to encompass all four panels or walls, or the walls/could have been separately fabricated, among other possible combinations of assembly. According to still further aspects of the embodiments, air plenum piece 106 need not have oriented in the manner shown, but could also have had channel 510 cross in a direction perpendicular to that as shown; e.g., channel 510 could have run between left side panel 612 and right side panel 614, as opposed to running between front panel 610 and rear panel 304.

According to further aspects of the embodiments, the relative position and location of the air inlets as not being on a same surface of the air exhausts means that little or no hot exhaust air can be vacuumed into the air inlets; because of this configuration, only ambient air, or at least not hot air from the same enclosure will be pulled in by fan 402 through air inlets so that the cooling benefit of the moving air will be maximized. According to still further aspects of the embodiments, the relatively far distance between the blades of fan 402 and the air inlets means that the acoustical noise generated by the fan will be substantially minimized, and the cooling effectiveness substantially maximized. According to aspects of the embodiments, the height or distance of air plenum piece 106 above fan 402 can be about equal to the diameter of the blades of fan 402 in order to substantially minimize acoustical noise generated by fan 402.

According to additional aspects of the embodiments, the acoustical noise generated by the fan can be further decreased by reducing the rotational speed (number of RPM) of the fan when maximum cooling is not needed but some cooling is still required. As an example, when power to the circuitry is shut off or reduced after normal operation of the circuitry, the circuitry may still require some cooling, though not requiring the same air flow as needed during normal operation. By continuing to operate the fan at a reduced number of RPM, cooling of the circuitry continues for a time and quieter operation is attained.

According to aspects of other embodiments, in place of operating the fan at a reduced RPM, the circuitry is cooled by providing a configuration in which the heat sink is shaped to provide a passive heat conduction path from the circuitry to one or more surfaces of the housing, where the heat dissipates, for example, to the surrounding air. By providing this additional heat conduction path, heat continues to be drawn from the circuitry even after power to the circuitry is reduced or removed, so that the fan may be completely shut down at this time. As a result, fan noise after power down or power reduction is eliminated.

FIG. 7 illustrates an exploded perspective view of a housing of electronic circuitry in which a cooling apparatus has been implemented according to aspects of the other embodiments. Electronic circuitry cooling apparatus (cooling apparatus) 700 includes a lower portion 702, a circuit board 704, a heat sink with cooling fan (heat sink) 706, an air plenum piece (APP) 708, and an upper portion 710.

Referring now to FIG. 8A, a perspective view of the lower portion 702 of the cooling apparatus 700 is shown. The lower portion 702 includes a rear air inlet 802, which is located on a rear panel 804, and a bottom panel 806. The structure and function of the lower portion 702 is similar to that of the lower portion 302 shown in FIGS. 1-3.

FIG. 8B shows a perspective view of the circuit board 704. The circuit board is typically supported by the lower portion 702. The circuit board includes a circuit board panel 812 upon which are mounted various circuitry 814. Some or all of the circuitry 814, or at least those elements that require cooling, are mounted within a "footprint" of where the heat sink 706 will overlie, depicted in this example by the region enclosed by dashed line 816. The heat sink 706 will be in thermal contact with the circuitry within this region.

FIG. 8C depicts a perspective view of the heat sink 706. The heat sink includes a lower horizontal portion 824 that is disposed atop the circuitry 814. A bottom surface of the lower horizontal portion 824 is in thermal contact with the circuitry 814 and is configured to draw heat away from the circuitry. An array of pins 830 is disposed on an opposing surface of the lower horizontal portion 824 and conducts heat away from the circuitry 814 and from the lower horizontal surface 824. A cooling fan 822 is located atop of heat sink 706 and, when operating, draws air over the array of pins 830 to transfer heat to air circulated by the fan.

The heat sink 706 also includes vertical walls 826 which are located, for example, at each end of the lower horizontal portion 824 and which extend at one end from the lower horizontal portion 824. At an opposing end of each vertical wall 826 is disposed a raised horizontal portion 828. The vertical walls 826 and the raised horizontal portions 828 provide an alternative path for conducting heat away from the circuitry 814. That is, when the cooling apparatus 700 is assembled, the raised horizontal portions 828 are in thermal contact with the upper portion 710 and allow heat from the circuitry, for example, to radiate and convect into the surrounding air or to an external heat sink. Thus, when the cooling fan 822 is not in operation, cooling for the circuitry 814 is still provided.

FIG. 8D provides a perspective view of the air plenum piece 708. The air plenum piece includes a plenum planar portion 848, vertical tabs 846, and an air plenum hole 842 located on plenum planar portion 848. The air plenum piece 708 is configured to form a channel 850 and direct the flow of air in a manner similar to that described regarding the air plenum piece 106.

The plenum planar portion 848 of the air plenum piece 708, however, has a narrower width in the region that overlies the heat sink 706 to permit the vertical walls 826 of the heat sink 706 to extend upward above the air plenum piece 708 and allow the raised horizontal portions 828 of the heat sink 706 to contact the upper housing when the cooling apparatus 700 is assembled. The vertical walls 826 of the heat sink 706 are also configured to fit tightly against the edges of the planar portion 848 and serve in place of the vertical tabs 846 in that region of the air plenum piece 708. Thus, the combination of the vertical tabs 846 and the vertical walls 826 of the heat sink 706 substantially provide a single path for the intake air pulled in by fan 822.

FIG. 8E depicts a perspective view of the upper portion 710 of the cooling apparatus 700. The upper portion includes a front panel 870, a left side panel 872, a right side panel 874, and an upper panel 876. The front panel 870 includes a plurality of front air inlets 864. The left side panel 872 includes left side air exhaust openings 866a, and the right side panel 874 includes right side air exhaust openings 866b. Further, the top portion 876 includes a plurality of top air inlet openings 862. The structure of the upper portion 710 is similar to that of the upper portion 108 shown in FIGS. 1-2 and 6.

According to aspects of the embodiments, when the fan 822 operates, the circuitry is cooled by the cooling apparatus 700 in a manner similar to that carried out by the cooling apparatus 100. Namely, cooling intake air is drawn in through the top air inlet 862, the front air inlet 864, and the rear air inlet 802 by the fan 822. As the intake air is drawn in, the intake air is directed along the top surface of the air plenum piece 708 and provides a single path for the intake air pulled in by fan 822. That is, the air plenum piece 708, together with the vertical walls 826 of the heat sink 706, substantially seals the upper portion of the interior of the housing from the lower portion (the volume below the air plenum piece 708), which includes the circuit board 704 and the upper surface of the lower portion 702. Further, since all of the air intake openings (802, 862, 864) are located in the space defined by the upper level of the air plenum piece 708 and the interior lower surface of upper portion 710, the intake air travels through the air channel 850 to the hole 842 via operation of the fan 822.

The air drawn through the hole 842 by the fan 822 then passes over the pin array 830 of the heat sink 706 and removes heat from the heat sink 706 and from the circuitry 814 located on the circuit board 704 that is in thermal contact with the lower horizontal portion 824 of the heat sink. The warmed output air (output air) is then expelled through side air exhausts 866a,866b.

Alternatively, according to aspects of the embodiments, when the fan 822 does not operate, the cooling apparatus 700 is still able to remove heat from the circuitry because of the configuration of the heat sink 706 and the air plenum piece 708. Namely, the vertical walls 826 of the heat sink 706, which extend upward from the lower horizontal portion 824 of the heat sink and past the narrower region of the air plenum piece 708, and the upper horizontal portions 828 of the heat sink, which contact the upper panel 876 of the upper portion 710, provide an alternative path for heat conduction. The vertical walls 826 and the upper horizontal portions 828 of the heat sink 706 conduct heat away from the circuitry to the upper panel 876 of the upper portion 710 where the heat circulates to the air that is external to the upper panel 876.

Therefore, according to aspects of the embodiments, during full power operation of the circuitry, cooling of the circuitry is provided by operation of the fan 824 to draw air through the housing in the manner described above. Thereafter, when power to the circuitry is removed or reduced, the fan 824 is shut off and the cooling apparatus 700 continues to cool the circuitry by the heat sink 706 conducting heat to the upper panel 876. As a result, heat is still removed from the circuitry without the generation of sound caused by operation of the fan 824.

According to further aspects of the embodiments, front to back airflow is often needed to cool the electronic circuitry contained in equipment housings, such as the circuitry contained in rack mounted equipment housings. Known equipment housings often use openings in the top, bottom and sides of the housing to allow cooling air intake and exhaust. When equipment housings are rack mounted, however, the top and bottom openings are typically blocked by other units in the rack. Moreover, the side openings are usually blocked by the side pillars of the equipment. As a result, only airflow between the front and back walls of the housing is available to cool the electronic circuitry.

The front and back walls of the rack mounted housings, however, are also needed for other purposes. For example, areas of the front and back walls are often needed for electrical power connectors, data cable connectors, LED indicators and displays, other types of displays and meters, control buttons, etc. Therefore, not all of the front and back walls of rack mounted housings can be used for cooling air flow.

Further, existing rack mounted housings may use axial fans mounted on the front or back surface of the housing to draw cooling air through openings in the front and/or back surface. Such axial fans take up space on the front or back walls that may be needed for connectors, etc.

It is therefore desirable to provide cooling for the circuitry in the housing in a manner that reduces the portion of the front and back surfaces that are needed for such cooling.

According to further aspects of the embodiments, an air plenum and fan combination is used. The air plenum and fan combination draws cooling air entering through openings in, for example, the front wall of the housing, directs the cooling air over the electronic devices that produce the heat, and then directs the now-heated air to exiting through openings in in, for example, the back surface of the housing.

The air plenum is fabricated from a thin material and is attached to an inside of, for example, the front surface of the housing adjacent to openings in the front surface of the housing. The air plenum traverses across the inside of the housing over the electronic devices that produce heat. An opening is located in the air plenum allows the incoming air to be drawn by a rotating fan that moves the air down the opening and across a heat-sink that is thermally coupled to the electronic devices. The moving hot air is then directed from the heat-sink and out of, for example, the rear of the unit by air pressure created by the fan.

FIG. 9 is an exploded perspective view of a housing of electronic circuitry in which a cooling apparatus has been implemented according to aspects of the further embodiments. Electronic circuitry cooling apparatus (cooling apparatus) 900 includes a lower portion 902, a circuit board 904 disposed above the lower portion 902, a heat sink with cooling fan ("heat sink") 906 disposed above the circuit board 904, an air plenum piece (APP) 908 disposed above the heat sink 906, and an upper portion 910 disposed above the air plenum piece 908.

Referring now to FIG. 10A, a perspective view of the lower portion 902 of the cooling apparatus 900 is shown. The lower portion 902 includes a front panel 1002, a rear panel 1004, and a bottom panel 1006 disposed between the front panel 1002 and the rear panel 1004. A plurality of openings formed in an upper portion of the front panel 1002 define front air inlet openings 1008, a plurality of openings formed in an upper portion of the rear panel 1004 define rear air outlet openings 1010.

FIG. 10B is a perspective view of the circuit board 904. The circuit board is typically supported by the lower portion 902. The circuit board includes a circuit board panel 1012 upon which are mounted various circuitry 1014. Some or all of the circuitry 1014, or at least those elements that require cooling, are mounted within a "footprint" of where the heat sink 906 will overlie, depicted in this example by the region enclosed by dashed line 1016. The heat sink 906 will be in thermal contact with the circuitry within this region.

FIG. 10C is a perspective view of the heat sink 906. The heat sink includes a horizontal heat sink panel 1024 that is disposed atop the circuitry 1014. A bottom surface of the heat sink panel 1024 is in thermal contact with the circuitry 1014 and is configured to draw heat away from the circuitry. An array of pins 1030 is disposed on an opposing surface of the heat sink panel 1024 and conducts heat away from the circuitry 1014 and from the heat sink panel 1024. A cooling fan 1022 is located atop of heat sink 906 and, when operating, draws air over the array of pins 1030 to transfer the heat to air circulated by the fan.

FIG. 10D is a perspective view of the air plenum piece 908. The air plenum piece includes a plenum planar portion 1048, and an air plenum hole 1042 formed in the plenum planar portion 1048. The plenum planar portion 1048 has a trapezoidal shape. A respective side vertical tab 1044 extends from each of the side edges of the trapezoidal-shaped plenum planar portion 1048. A rear vertical tab 1046 extends from the rear edge of the plenum planar portion 1048. The side-to-side length of the front end of the planar portion 1048 may be substantially the same as the side-to-side length of the portion of the front panel 1002 that contains the front air inlet openings 1008. The side-to-side length of the front end of the planar portion 1048 may also be substantially the same as the side-to-side length of the portion of the rear panel 1004 that contains the rear air inlet openings 1010.

FIG. 10E is a perspective view of the upper portion 910 of the cooling apparatus 900. The upper portion includes left and right side panels 1064 and an upper panel 1062. A plurality of openings formed in the left side panel 1064 define a left side air outlet 1066a, and a plurality of openings formed in the right side panel 1064 define a right side air outlet 1066b.

FIG. 11A shows a perspective view of the cooling apparatus 900 when the lower portion 902, the circuit board 904, the heat sink 906, the air plenum piece 908, and the upper portion 910 shown in FIG. 9 are assembled. FIG. 11B shows a transparent perspective view of the assembled cooling apparatus 900 and depicts the airflow during operation thereof.

The planar portion 1048 of the air plenum piece 908 is arranged to abut, at one end, an inner wall of the front panel 1002. The side vertical tabs 1044 and rear vertical tab 1046 abut, at their upper ends, an inner wall of the top panel 1062. The combination of the plenum planar portion 1048 and the vertical tabs 1044,1046 provide a single path for intake air 1102 drawn through the front air inlet openings 1008 by the fan 1022.

The intake air 1102 is then drawn through the plenum air hole 1042 by the fan 1022 and directed onto the pin array 1030 of the heat sink 906 where the air removes heat that the heat sink 906 has drawn from the circuitry 1014 located on the circuit board 904 and that is in thermal contact with the panel 1024 of the heat sink. The warmed air is then driven, by the fan 1022, from underneath the air plenum piece 908 into the spaces formed between the rear vertical tab 1046 and the rear panel 1004 and between the side vertical tabs 1044 and the side panels 1064. The exhaust air (output air) 1104 is then expelled by the air current through the rear air outlet openings 1010 of the rear panel 1004. When one or both of the side air outlet openings 1066a,1066b of the side panels 1064 are unobstructed, such as when the container 900 is not mounted in a rack, the exhaust air 1104 may also be expelled through the of the side air outlet openings 1066a,1066b.

In this manner, the cooling air 1102 is drawn into and through the housing 900 to cool the circuitry contained in the housing and is then driven out of the housing as the exhaust air 1104. Further, by placing the front air inlet openings 1008 only in the upper portion of the front panel 1002, space is preserved on the front panel for placement of connectors and displays, etc. Similarly, by placing the rear air outlet openings 1010 only in the upper portion of the rear panel 1004, space is preserved on the rear panel for connectors and the like.

FIG. 12 is an exploded perspective view of a housing of electronic circuitry in which a cooling apparatus has been implemented according to additional aspects of the further embodiments. Electronic circuitry cooling apparatus (cooling apparatus) 1200 includes a lower portion 1202, a circuit board 1204 disposed above the lower portion 1202, a heat sink with cooling fan ("heat sink") 1206 disposed above the circuit board 1204, an air plenum piece (APP) 1208 disposed above the heat sink 1206, and an upper portion 1210 disposed above the air plenum piece 1208.

Referring now to FIG. 13A, a perspective view of the lower portion 1202 of the cooling apparatus 1200 is shown. The lower portion 1202 includes a front panel 1302, a rear panel 1304, and a bottom panel 1306 disposed between the front panel 1302 and the rear panel 1304. A plurality of openings formed in an upper portion of the front panel 1302 define front air inlet openings 1308, a plurality of openings formed in an upper portion of the rear panel 1304 define rear air outlet openings 1310.

FIG. 13B is a perspective view of the circuit board 1204. The circuit board is typically supported by the lower portion 1202. The circuit board includes a circuit board panel 1312 upon which are mounted various circuitry 1314. Some or all of the circuitry 1314, or at least those elements that require cooling, are mounted within a "footprint" of where the heat sink 1206 will overlie, depicted in this example by the region enclosed by dashed line 1316. The heat sink 1206 will be in thermal contact with the circuitry within this region.

FIG. 13C is a perspective view of the heat sink 1206. The heat sink includes a horizontal heat sink panel 1324 that is disposed atop the circuitry 1314. A bottom surface of the heat sink panel 1324 is in thermal contact with the circuitry 1314 and is configured to draw heat away from the circuitry. An array of pins 1330 is disposed on an opposing surface of the heat sink panel 1324 and conducts heat away from the circuitry 1314 and from the heat sink panel 1324. A cooling fan 1322 is located atop of heat sink 1206 and, when operating, draws air over the array of pins 1330 to transfer the heat to air circulated by the fan.

FIG. 13D is a perspective view of the air plenum piece 1208. The air plenum piece includes a plenum planar portion 1348, and an air plenum hole 1342 formed in the plenum planar portion 1348. The plenum planar portion 1348 has a rectangular shape. A side vertical tab 1344 extends from each side edge of the rectangular-shaped plenum planar portion 1348. A rear vertical tab 1346 extends from the rear edge of the plenum planar portion 1348. The side-to-side length of the planar portion 1348 may be substantially the same as the side-to-side length of the portion of the front panel 1302 that contains the front air inlet openings 1308. The side-to-side length of the planar portion 1348 may also be substantially the same as the side-to-side length of the portion of the rear panel 1304 that contains the rear air inlet openings 1310.

FIG. 13E is a perspective view of the upper portion 1210 of the cooling apparatus 1200. The upper portion includes left and right side panels 1364 and an upper panel 1362. A plurality of openings formed in the left side panel 1364 define a left side air outlet 1366a, and a plurality of openings formed in the right side panel 1364 define a right side air outlet 1366b.

FIG. 14A shows a perspective view of the cooling apparatus 1200 when the lower portion 1202, the circuit board 1204, the heat sink 1206, the air plenum piece 1208, and the upper portion 1210 shown in FIG. 12 are assembled. FIG. 14B shows a transparent perspective view of the assembled cooling apparatus 1200 and depicts the airflow during operation thereof.

The planar portion 1348 of the air plenum piece 1208 is arranged to abut, at one end, an inner wall of the front panel 1302. The side vertical tabs 1344 and rear vertical tab 1346 abut, at their upper ends, an inner wall of the top panel 1362. The combination of the plenum planar portion 1348 and the vertical tabs 1344,1346 provide a single path for intake air 1402 drawn through the front air inlet openings 1308 by the fan 1322.

The intake air 1402 is then drawn through the plenum air hole 1342 by the fan 1322 and directed onto the pin array 1330 of the heat sink 1206 where the air removes heat that the heat sink 1206 has drawn from the circuitry 1314 located on the circuit board 1204 and that is in thermal contact with the panel 1324 of the heat sink. The warmed air is then driven, by the fan 1322, from underneath the air plenum piece 1208 into the spaces formed between the rear vertical tab 1346 and the rear panel 1304 and between the side vertical tabs 1344 and the side panels 1364. The exhaust air (output air) 1404 is then expelled by the air current through the rear air outlet openings 1310 of the rear panel 1304. When one or both of the side air outlet openings 1366a, 1366b of the side panels 1364 are unobstructed, such as when the container 1200 is not mounted in a rack, the exhaust air 1404 may also be expelled through the of the side air outlet openings 1366a,1366b.

In this manner, the cooling air 1402 is drawn into and through the housing 1200 to cool the circuitry contained in the housing and is then driven out of the housing as the exhaust air 1404. Further, by placing the front air inlet openings 1308 only in the upper portion of the front panel 1302, space is preserved on the front panel for placement of connectors and displays, etc. Similarly, by placing the rear air outlet openings 1310 only in the upper portion of the rear panel 1304, space is preserved on the rear panel for connectors and the like.

FIG. 15 is an exploded perspective view of a housing of electronic circuitry in which a cooling apparatus has been implemented according to still additional aspects of the further embodiments. Electronic circuitry cooling apparatus (cooling apparatus) 1500 includes a lower portion 1502, a circuit board 1504 disposed above the lower portion 1502, a heat sink with cooling fan ("heat sink") 1506 disposed above the circuit board 1504, an air plenum piece (APP) 1508 disposed above the heat sink 1506, and an upper portion 1510 disposed above the air plenum piece 1508.

Referring now to FIG. 16A, a perspective view of the lower portion 1502 of the cooling apparatus 1500 is shown. The lower portion 1502 includes a front panel 1602, a rear panel 1604, and a bottom panel 1606 disposed between the front panel 1602 and the rear panel 1604. A plurality of openings formed in an upper portion of the front panel 1602 define front air inlet openings 1608, a plurality of openings formed in an upper portion of the rear panel 1604 define rear air outlet openings 1610.

FIG. 16B is a perspective view of the circuit board 1504. The circuit board is typically supported by the lower portion 1502. The circuit board includes a circuit board panel 1612 upon which are mounted various circuitry 1614. Some or all of the circuitry 1614, or at least those elements that require cooling, are mounted within a "footprint" of where the heat sink 1506 will overlie, depicted in this example by the region enclosed by dashed line 1616. The heat sink 1506 will be in thermal contact with the circuitry within this region.

FIG. 16C is a perspective view of the heat sink 1506. The heat sink includes a horizontal heat sink panel 1624 that is disposed atop the circuitry 1614. A bottom surface of the heat sink panel 1624 is in thermal contact with the circuitry 1614 and is configured to draw heat away from the circuitry. An array of pins 1630 is disposed on an opposing surface of the heat sink panel 1624 and conducts heat away from the circuitry 1614 and from the heat sink panel 1624. A cooling fan 1622 is located atop of heat sink 1506 and, when operating, draws air over the array of pins 1630 to transfer the heat to air circulated by the fan.

FIG. 16D is a perspective view of the air plenum piece 1508. The air plenum piece includes a plenum planar portion 1648, and an air plenum hole 1642 formed in the plenum planar portion 1648. A side vertical tab 1644 extends from each side edge of the plenum planar portion 1648. A rear vertical tab 1646 extends from the rear edge of the plenum planar portion 1648. The plenum planar portion 1648 has a square or rectangular shape and has substantially the same, or slightly larger, side-to-side length as that of the heat sink panel 1624. The side-to-side length of the planar portion 1648 may be substantially the same as the side-to-side length of the portion of the front panel 1602 that contains the front air inlet openings 1608. The side-to-side length of the portion of the rear panel 1604 that contains the rear air inlet openings 1610, however, is substantially greater than the side-to-side length of the planar portion 1648 and is also substantially greater than the side-to-side length of the portion of the front panel 1602 that contains the front air inlet openings 1608.

FIG. 16E is a perspective view of the upper portion 1510 of the cooling apparatus 1500. The upper portion includes left and right side panels 1664 and an upper panel 1662. A plurality of openings formed in the left side panel 1664 define a left side air outlet 1666a, and a plurality of openings formed in the right side panel 1664 define a right side air outlet 1666b.

FIG. 17A shows a perspective view of the cooling apparatus 1500 when the lower portion 1502, the circuit board 1504, the heat sink 1506, the air plenum piece 1508, and the upper portion 1510 shown in FIG. 15 are assembled. FIG. 17B shows a transparent perspective view of the assembled cooling apparatus 1500 and depicts the airflow during operation thereof.

The planar portion 1648 of the air plenum piece 1508 is arranged to abut, at one end, an inner wall of the front panel 1602. The side vertical tabs 1644 and rear vertical tab 1646 abut, at their upper ends, an inner wall of the top panel 1662. The combination of the plenum planar portion 1648 and the vertical tabs 1644,1646 provide a single path for intake air 1702 drawn through the front air inlet openings 1608 by the fan 1622.

The intake air 1702 is then drawn through the plenum air hole 1642 by the fan 1622 and directed onto the pin array 1630 of the heat sink 1506 where the air removes heat that the heat sink 1506 has drawn from the circuitry 1614 located on the circuit board 1504 and that is in thermal contact with the panel 1624 of the heat sink. The warmed air is then driven, by the fan 1622, from underneath the air plenum piece 1508 into the spaces formed between the rear vertical tab 1646 and the rear panel 1604 and between the side vertical tabs 1644 and the side panels 1664. The exhaust air (output air) 1704 is then expelled by the air current through the rear air outlet openings 1610 of the rear panel 1604. When one or both of the side air outlet openings 1666a, 1666b of the side panels 1664 are unobstructed, such as when the container 1500 is not mounted in a rack, the exhaust air 1704 may also be expelled through the of the side air outlet openings 1666a,1666b.

In this manner, the cooling air 1702 is drawn into and through the housing 1500 to cool the circuitry contained in the housing and is then driven out of the housing as the exhaust air 1704. Further, by placing the front air inlet openings 1608 only in the upper portion of the front panel 1602, space is preserved on the front panel for placement of connectors and displays, etc. Similarly, by placing the rear air outlet openings 1610 only in the upper portion of the rear panel 1604, space is preserved on the rear panel for connectors and the like.

FIG. 12 is an exploded perspective view of a housing of electronic circuitry in which a cooling apparatus has been implemented according to additional aspects of the further embodiments. Electronic circuitry cooling apparatus (cooling apparatus) 1800 includes a lower portion 1802, a circuit board 1804 disposed above the lower portion 1802, a heat sink with cooling fan ("heat sink") 1806 disposed above the circuit board 1804, an air plenum piece (APP) 1808 disposed above the heat sink 1806, and an upper portion 1810 disposed above the air plenum piece 1808.

Referring now to FIG. 19A, a perspective view of the lower portion 1802 of the cooling apparatus 1800 is shown. The lower portion 1802 includes a front panel 1902, a rear panel 1904, and a bottom panel 1906 disposed between the front panel 1902 and the rear panel 1904. A plurality of openings formed in an upper portion of the front panel 1902 define front air inlet openings 1908, a plurality of openings formed in an upper portion of the rear panel 1904 define rear air outlet openings 1910.

FIG. 19B is a perspective view of the circuit board 1804. The circuit board is typically supported by the lower portion 1802. The circuit board includes a circuit board panel 1912 upon which are mounted various circuitry 1914. Some or all of the circuitry 1914, or at least those elements that require cooling, are mounted within a "footprint" of where the heat sink 1806 will overlie, depicted in this example by the region enclosed by dashed line 1916. The heat sink 1806 will be in thermal contact with the circuitry within this region.

FIG. 19C is a perspective view of the heat sink 1806. The heat sink includes a horizontal heat sink panel 1924 that is disposed atop the circuitry 1914. A bottom surface of the heat sink panel 1924 is in thermal contact with the circuitry 1914 and is configured to draw heat away from the circuitry. An array of pins 1930 is disposed on an opposing surface of the heat sink panel 1924 and conducts heat away from the circuitry 1914 and from the heat sink panel 1924. A cooling fan 1922 is located atop of heat sink 1806 and, when operating, draws air over the array of pins 1930 to transfer the heat to air circulated by the fan.

FIG. 19D is a perspective view of the air plenum piece 1808. The air plenum piece includes a plenum planar portion 1948, and an air plenum hole 1942 formed in the plenum planar portion 1948. The plenum planar portion 1948 has a rectangular shape. The side-to-side length of the planar portion 1948 may be substantially the same as the side-to-side length of the portion of the front panel 1902 that contains the front air inlet openings 1908. The side-to-side length of the planar portion 1948 may also be substantially the same as the side-to-side length of the portion of the rear panel 1904 that contains the rear air inlet openings 1910.

A left side vertical tab 1944 extends from a left-side side edge of the rectangular-shaped plenum planar portion 1948. A right side vertical tab 1950 extends from a right-side side edge of the rectangular-shaped plenum planar portion 1948 and has a shorter front-to-rear length than that of the left side vertical tab 1944. The difference in the front-to-rear lengths of the left side vertical tab 1944 and the right side vertical tab 1950 is shown as cut-away portion 1952 along the right-side side edge of the rectangular-shaped plenum planar portion 1948.

A rear vertical tab 1946 extends from the rear edge of the plenum planar portion 1948.

FIG. 19E is a perspective view of the upper portion 1810 of the cooling apparatus 1800. The upper portion includes left and right side panels 1964 and an upper panel 1962. A plurality of openings formed in the left side panel 1964 define a left side air outlet 1966a, and a plurality of openings formed in the right side panel 1964 define a right side air outlet 1966b.

FIG. 20A shows a perspective view of the cooling apparatus 1800 when the lower portion 1802, the circuit board 1804, the heat sink 1806, the air plenum piece 1808, and the upper portion 1810 shown in FIG. 18 are assembled. FIG. 21A shows a cross-sectional view of the assembled cooling apparatus 1800 that is taken along line A-A of FIG. 20A and shows the plenum planar portion 1948 with the left side vertical tab 1944 and the right side vertical tab 1950. FIG. 21B shows a cross-sectional view of the assembled cooling apparatus 1800 that is taken along line B-B of FIG. 20A and shows the plenum planar portion 1948 with the left side vertical tab 1944 and the cut-away portion 1952 in place of the right side vertical tab 1950. FIG. 21C shows a cross-sectional view of the assembled cooling apparatus 1800 that is taken along line C-C of FIG. 20A and shows the plenum planar portion 1948 with the rear vertical tab 1946.

FIG. 20B shows a transparent perspective view of the assembled cooling apparatus 1800 and depicts the airflow during operation thereof. The planar portion 1948 of the air plenum piece 1808 is arranged to abut, at one end, an inner wall of the front panel 1902. The side vertical tabs 1944 and rear vertical tab 1946 abut, at their upper ends, an inner wall of the top panel 1962. The combination of the plenum planar portion 1948 and the vertical tabs 1944,1946 provide a single path for intake air 2002 drawn through the front air inlet openings 1908 by the fan 1922.

The intake air 2002 is then drawn through the plenum air hole 1942 by the fan 1922 and directed onto the pin array 1930 of the heat sink 1806 where the air removes heat that the heat sink 1806 has drawn from the circuitry 1914 located on the circuit board 1804 and that is in thermal contact with the panel 1924 of the heat sink. The warmed air is then driven, by the fan 1922, from underneath the air plenum piece 1808 into the spaces formed between the rear vertical tab 1946 and the rear panel 1904, between the left side vertical tab 1944 and its adjacent side panel 1964, and between the right side vertical tab 1950 and its adjacent side panel 1964. A portion of the warmed air is returned through the cut-away portion 1952 into the space above the plenum planar portion 1948 as recirculated air stream 1006 which mixes with the cooling air stream 2002.

Exhaust air (output air) 2004 is then expelled by the air current through the rear air outlet openings 1910 of the rear panel 1904. When one or both of the side air outlet openings 1966a,1966b of the side panels 1964 are unobstructed, such as when the container 1800 is not mounted in a rack, the exhaust air 2004 may also be expelled through the of the side air outlet openings 1966a,1966b.

In this manner, the cooling air 2002 is drawn into and through the housing 1800 to cool the circuitry contained in the housing and is then driven out of the housing as the exhaust air 2004. Further, by placing the front air inlet openings 1908 only in the upper portion of the front panel 1902, space is preserved on the front panel for placement of connectors and displays, etc. Similarly, by placing the rear air outlet openings 1910 only in the upper portion of the rear panel 1904, space is preserved on the rear panel for connectors and the like.

As discussed in regard to one or more of the figures described herein, reference is made to several dimensions, including several radii, angles, height, among others. Those of skill in the art can appreciate that although examples of dimensions are provided, these should not be taken in a limiting manner; that is, the aspects of the embodiments are not to be construed as defined or limited by the specific example of the dimensions shown and discussed, but instead are provided merely for illustrating an example of what a device that incorporates the aspects of the embodiments could, in a non-limiting manner, look like. Furthermore, as those of skill in the art can appreciate, since the aspects of the embodiments are directed towards a physical object, with dimensional characteristics, all of the parts will have various dimensions, some of which are not shown in fulfillment of the dual purposes of clarity and brevity. According to still further aspects of the embodiments, some of these objects will have dimensional characteristics that lend themselves to aesthetic aspects; in fulfillment of the dual purposes of clarity and brevity, dimensions in this regard have also been omitted. Therefore, as the aspects of the embodiments are directed towards a cooling apparatus for use with cooling electronic circuitry, it is to be understood that the dimensions of the different objects, some dimensions shown, some dimensions not shown, will be understood by those of skill in the art.

The disclosed embodiments provide systems, methods, and modes for cooling of circuitry located within rack mounted equipment housings. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

INDUSTRIAL APPLICABILITY

To solve the aforementioned problems, the aspects of the embodiments are directed towards systems, methods, and modes for cooling of circuitry located within rack mounted equipment housings that substantially eliminates or prevents problems associated with currently available technology.

ALTERNATE EMBODIMENTS

Alternate embodiments may be devised without departing from the spirit or the scope of the embodiments.

What is claimed is:

1. An apparatus for cooling electronic circuitry, the apparatus comprising:
    an enclosure configured to surround the electronic circuitry, the enclosure including a plurality of panels, wherein
        a first one of the plurality of panels faces a first direction,
        a plurality of air intake holes are disposed in the first one of the plurality of panels only in a portion thereof,
        a second one of the plurality of panels faces a second direction that is opposite to that of the first direction, and
        a plurality of air exhaust holes are disposed in the second one of the plurality of panels only in a portion thereof; and
    an air plenum piece disposed within the enclosure and including
        a substantially planar portion that extends from an inner wall of the first one of the plurality of panels and that ends at a distance from an inner wall of the second one of the plurality of panels, and
        at least one tab that extends from the substantially planar portion of the air plenum piece to an inner wall of an upper one of the plurality of panels,
        the air plenum piece being configured to divide an interior region of the enclosure into a first volume into which the plurality of air intake holes open and a second volume into which the plurality of air exhaust holes open,
        the first volume being enclosed by the inner wall of the first one of the plurality of panels, the substantially planar portion of the air plenum piece, the at least one tab of the air plenum piece, and the inner wall of the upper one of the plurality of panels,
        the second volume being a remaining volume of the interior region,
        the air plenum piece having an air plenum hole that forms an opening between the first volume and the second volume.

2. The apparatus of claim 1, wherein
the at least one tab of the air plenum piece includes an end tab located at an edge of the substantially planar portion of the air plenum piece that is closest to the inner wall of the second one of the plurality of panels.

3. The apparatus of claim 1, wherein
the at least one tab of the air plenum piece includes at least one side tab located at a side edge of the substantially planar portion of the air plenum piece, the side edge of the substantially planar portion of the air plenum piece being spaced apart from an inner wall of an adjacent side panel of the plurality of panels.

4. The apparatus of claim 3, wherein
the at least one side tab extends only along a portion of the side edge of the substantially planar portion of the air plenum piece, so that at least some of the air in the second volume is recirculated into the first volume.

5. The apparatus of claim 3, wherein
the at least one tab of the air plenum piece includes at least another side tab located at another side edge of the substantially planar portion of the air plenum piece, the another side edge of the substantially planar portion of the air plenum piece being spaced apart from an inner wall of another side panel of the plurality of panels.

6. The apparatus of claim 1, wherein
the substantially planar portion of the air plenum piece is trapezoidal shaped.

7. The apparatus of claim 1, wherein
a side-to-side length of the portion of the first one of the plurality of panels in which the plurality of air intake holes are disposed has a same value as a side-to-side length of the portion of the second one of the plurality of panels in which the plurality of air exhaust holes, and
each side-to-side length corresponds to a distance between two side edges of the substantially planar portion of the air plenum piece.

8. The apparatus of claim 1, wherein
a side-to-side length of the portion of the first one of the plurality of panels in which the plurality of air intake holes are disposed corresponds to a distance between two side edges of the substantially planar portion of the air plenum piece, and
a side-to-side length of the portion of the second one of the plurality of panels in which the plurality of air exhaust holes are disposed has a greater value than the side-to-side length of the portion of the first one of the plurality of panels in which the plurality of air intake holes are disposed.

9. The apparatus of claim 1, further comprising
a fan located in coaxial alignment with the air plenum hole such that when the fan operates, cooling air is drawn from an exterior of the enclosure through the plurality of air intake holes into the first volume, then through the air plenum hole into the second volume, and thereafter from the second volume through the plurality of air exhaust holes into the exterior of the enclosure.

10. The apparatus of claim 9, further comprising
a heat sink configured to be in thermal contact with the electronic circuitry and conduct heat generated by the electronic circuitry, and
the cooling air drawn by the fan removes the heat from the heat sink.

11. The apparatus of claim 10, wherein
the heat sink and the electronic circuitry are each located in the second volume.

12. The apparatus of claim 1, wherein the plurality of panels further comprises
a bottom panel configured to support a circuit board holding the electronic circuitry.

13. The apparatus of claim 1, wherein the plurality of panels further comprises
at least one side panel, and
a further plurality of air exhaust holes disposed in the at least one side panel.

* * * * *